US012223135B2

(12) United States Patent
Jeong et al.

(10) Patent No.: US 12,223,135 B2
(45) Date of Patent: Feb. 11, 2025

(54) DISPLAY DEVICE INCLUDING INPUT SENSOR WITH MULTIPLE SENSING AREAS

(71) Applicant: SAMSUNG DISPLAY CO., LTD., Yongin-si (KR)

(72) Inventors: Yeri Jeong, Yongin-si (KR); Gyeongnam Bang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/361,784

(22) Filed: Jul. 28, 2023

(65) Prior Publication Data

US 2024/0118766 A1   Apr. 11, 2024

(30) Foreign Application Priority Data

Oct. 6, 2022 (KR) .................. 10-2022-0127963
Jan. 13, 2023 (KR) .................. 10-2023-0005667

(51) Int. Cl.
*G06F 3/041* (2006.01)
*G06F 3/044* (2006.01)

(52) U.S. Cl.
CPC ........ *G06F 3/04164* (2019.05); *G06F 3/0412* (2013.01); *G06F 3/0443* (2019.05); *G06F 3/0446* (2019.05); *G06F 3/0448* (2019.05); *G06F 2203/04103* (2013.01); *G06F 2203/04107* (2013.01); *G06F 2203/04111* (2013.01)

(58) Field of Classification Search
CPC .. G06F 3/04164; G06F 3/0448; G06F 3/0443; G06F 3/0412; G06F 3/0446; G06F 2203/04107; G06F 2203/04111; G06F 2203/04103

USPC ........................................................ 345/174
See application file for complete search history.

(56) References Cited

U.S. PATENT DOCUMENTS

| 8,537,124 | B2 | 9/2013 | Lee et al. | |
|---|---|---|---|---|
| 9,851,865 | B2 | 12/2017 | Bok | |
| 10,152,147 | B2 | 12/2018 | Choi et al. | |
| 11,500,501 | B2 | 11/2022 | Lee et al. | |
| 2012/0050193 | A1* | 3/2012 | Noguchi | G02F 1/133707 345/173 |
| 2014/0152616 | A1* | 6/2014 | Kida | G06F 3/0418 345/174 |
| 2017/0108972 | A1* | 4/2017 | Kurasawa | G06F 3/0412 |
| 2017/0255296 | A1* | 9/2017 | Takiguchi | G06F 3/0445 |
| 2018/0260061 | A1* | 9/2018 | Hirota | G02F 1/133345 |
| 2019/0012016 | A1* | 1/2019 | Kurasawa | G06F 3/04166 |

(Continued)

FOREIGN PATENT DOCUMENTS

| CN | 112783365 A | 5/2021 |
|---|---|---|
| CN | 113380864 | 8/2021 |

(Continued)

*Primary Examiner* — Tom V Sheng
(74) *Attorney, Agent, or Firm* — F. CHAU & ASSOCIATES, LLC

(57) ABSTRACT

A display device includes first and second input sensors and a display panel. The first and second input sensors are disposed in different sensing areas from each other. The first and second input sensors each include a first electrode and a second electrode crossing the first electrode. The first and second trace lines are connected to the first electrode. The trace line of the first and second trace lines, that overlaps the sensing area, overlaps the first electrode and does not overlap the second electrode in the sensing area.

20 Claims, 24 Drawing Sheets

(56) References Cited

U.S. PATENT DOCUMENTS

| | | | |
|---|---|---|---|
| 2019/0012017 A1* | 1/2019 | Kurasawa | G09G 3/3696 |
| 2021/0064188 A1* | 3/2021 | Lee | G06F 3/0448 |
| 2021/0173518 A1* | 6/2021 | Moon | G06F 3/0412 |
| 2022/0004282 A1 | 1/2022 | Lee et al. | |
| 2022/0100324 A1* | 3/2022 | Kida | G06F 3/0446 |
| 2022/0382416 A1 | 12/2022 | Gogte et al. | |
| 2023/0065926 A1 | 3/2023 | Kuo et al. | |
| 2023/0157107 A1* | 5/2023 | Lee | H10K 59/131 |
| | | | 257/72 |
| 2023/0315224 A1* | 10/2023 | Lee | G06F 3/0416 |
| | | | 345/175 |
| 2024/0036689 A1* | 2/2024 | Kim | G06F 3/0445 |

FOREIGN PATENT DOCUMENTS

| | | |
|---|---|---|
| KR | 10-1462149 | 12/2014 |
| KR | 10-1493558 | 2/2015 |
| KR | 10-2166853 | 10/2020 |
| KR | 10-2301502 | 9/2021 |
| KR | 10-2022-00052 | 1/2022 |
| WO | WO2021159845 A1 | 8/2021 |

\* cited by examiner

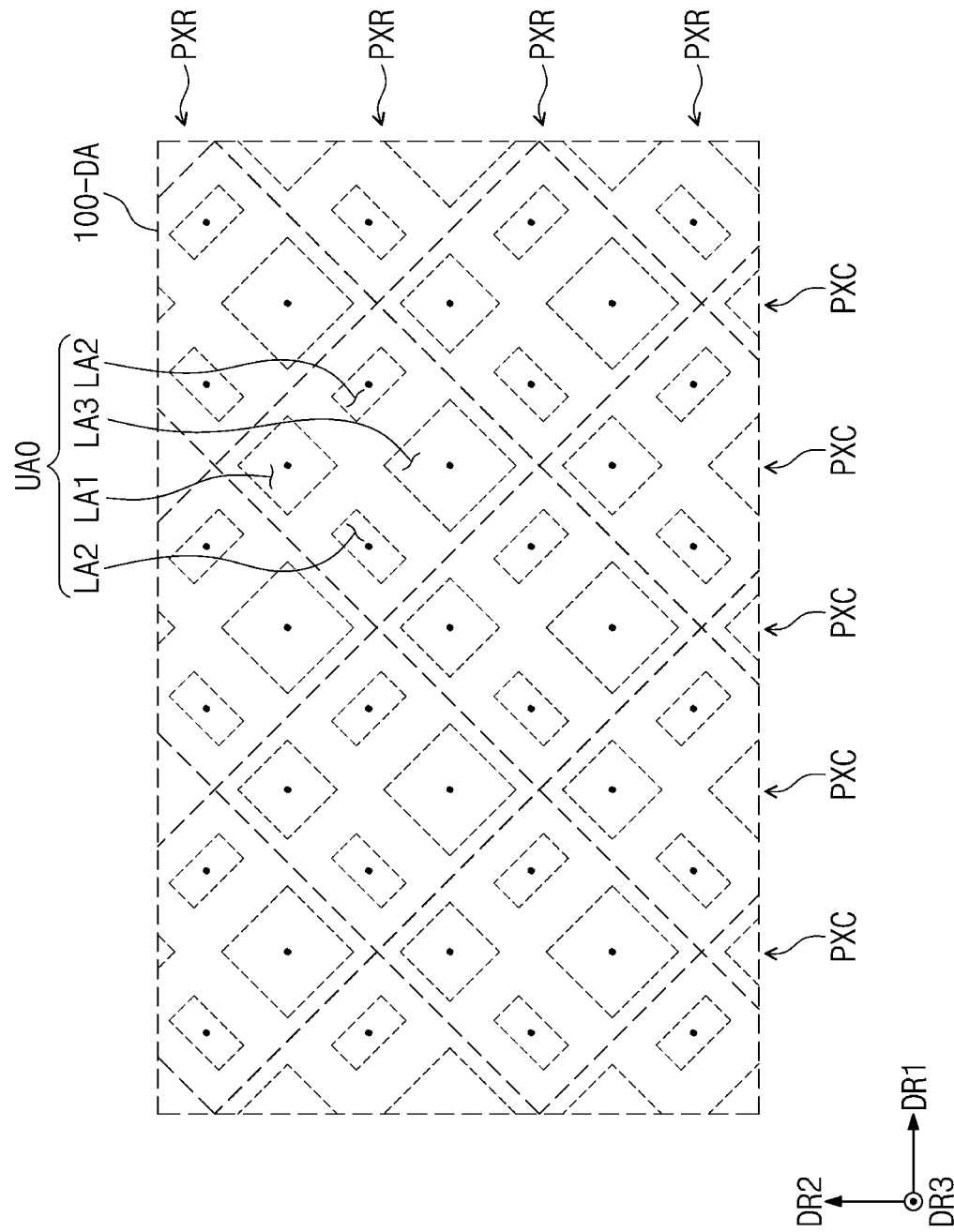

DISPLAY DEVICE INCLUDING INPUT SENSOR WITH MULTIPLE SENSING AREAS

This U.S. non-provisional patent application claims priority under 35 U.S.C. § 119 to Korean Patent Application No. 10-2022-0127963, filed on Oct. 6, 2022 and Korean Patent Application No. 10-2023-0005667, filed on Jan. 13, 2023, the contents of which are hereby incorporated by references in their entirety.

TECHNICAL FIELD

The present disclosure relates to a display device. More particularly, the present disclosure relates to a display device including an input sensor with multiple sensing areas.

DISCUSSION OF THE RELATED ART

Various display devices used in multimedia devices, such as televisions, mobile phones, tablet computers, navigation devices, and game consoles, are being developed. Devices, such as a keyboard, a mouse, etc., are used as an input device for these multimedia devices. In addition, an input sensors incorporated into the display devices are used as an input devices for the multimedia devices.

SUMMARY

A display device includes a display panel including a display area and a non-display area adjacent to the display area. A first input sensor is disposed on the display panel and overlaps a first area of the display area. A second input sensor is disposed on the display panel and overlaps a second area of the display area. The first input sensor includes an insulating layer, a first electrode, a second electrode intersecting the first electrode, a first trace line electrically connected to the first electrode, a second trace line electrically connected to the first electrode, and a third trace line electrically connected to the second electrode. Either the first trace line or the second trace line is a primary trace line that overlaps the first area of the display area. The primary trace line overlaps the first electrode and does not overlap the second electrode in the first area of the display area.

The first electrode may extend substantially in a first direction in the display area. The second electrode may include a plurality of divided electrodes extending substantially in a second direction crossing the first direction in the display area and spaced apart from each other in the first direction. The primary trace line may be disposed between the divided electrodes in the display area.

Each of the divided electrodes may be a single integral unit and may be disposed on the insulating layer. The first electrode may include a plurality of sensing patterns disposed on the insulating layer and arranged in the first direction and a plurality of bridge patterns each being disposed under the insulating layer and connecting the sensing patterns adjacent to each other among the sensing patterns via a contact hole defined through the insulating layer.

The primary trace line may be disposed under the insulating layer. The first input sensor may further include a plurality of dummy electrodes. The dummy electrodes and the primary trace line may be disposed on a same layer, and the dummy electrodes may overlap the sensing patterns.

The display area may include a plurality of light emitting areas and a non-light-emitting area disposed between the light emitting areas. The primary trace line and the dummy electrodes may overlap the non-light-emitting area.

Each of the divided electrodes may be provided with a plurality of openings defined therethrough.

Each of the divided electrodes may include line components that define the openings, and the lines components may include a first line component extending in the first direction and a second line component extending in the second direction.

The light emitting areas may include a first color light emitting area, a second color light emitting area, and a third color light emitting area. The first color light emitting area, the second color light emitting area, and the third color light emitting area may define a unit light emitting area.

The unit light emitting area may include a first unit light emitting area in which the first color light emitting area and the second color light emitting area are disposed at one side of the third color light emitting area and the third color light emitting area is disposed at a lower side with respect to the first color light emitting area and the second color light emitting area in the second direction and a second unit light emitting area in which the first color light emitting area and the second color light emitting area are disposed at the one side of the third color light emitting area and the third color light emitting area is disposed at an upper side with respect to the first color light emitting area and the second color light emitting area in the second direction. The first unit light emitting area and the second unit light emitting area may be alternately arranged with each other in the first direction and the second direction, and the openings may include a first opening corresponding to the first color light emitting area, a second opening corresponding to the second color light emitting area, and a third opening commonly corresponding to the third color light emitting area of the first unit light emitting area and the third color light emitting area of the second unit light emitting area, that are disposed adjacent to each other in the second direction.

Each of the sensing patterns may include a first line component extending in the first direction and a second line component extending in the second direction. Each of the dummy electrodes may include a first line component extending in the first direction and a second line component extending in the second direction. The first line component of the sensing patterns may overlap the first line component of the dummy electrodes. The first line component of each of the sensing patterns may have a width that is greater than a width of the first line component of each of the dummy electrodes.

The first electrode may include a plurality of sensing patterns extending substantially in the second direction and spaced apart from each other in the first direction in the display area. The primary trace line may overlap at least one sensing pattern among the sensing patterns and may be connected to the at least one sensing pattern overlapping thereto among the sensing patterns in the display area.

The insulating layer may be disposed between the one trace line and the divided electrodes in the display area, and the primary trace line may be connected to the at least one sensing pattern overlapping thereto among the sensing patterns via a contact hole defined through the insulating layer.

The first trace line may be connected to the first electrode at a first point. The second trace line may be connected to the first electrode at a second point. The third trace line may be connected to the second electrode at a third point. The primary trace line may be the second trace line. The second point may be disposed in the first area of the display area. Each of the first point and the third point may be disposed in the non-display area or disposed closer to the non-display area than the second point is.

The second input sensor may have a same composition as the first input sensor.

The first trace line may be connected to the first electrode at a first point. The second trace line may be connected to the first electrode at a second point. The third trace line may be connected to the second electrode at a third point. The first input sensor may further include a fourth trace line connected to the second electrode at a fourth point. The fourth point may be disposed in the non-display area or may be disposed closer to the non-display area than the second point is.

The display device may further include a third input sensor disposed on the display panel and overlapping a third area defined between the first area and the second area of the display area. The third input sensor may include a first-first electrode corresponding to the first electrode, a second-first electrode corresponding to the second electrode and crossing the first-first electrode, a first-first trace line electrically connected to the first-first electrode, and a second-first trace line electrically connected to the second-first electrode. The first-first trace line may overlap the third area of the display area and may extend substantially in the same direction as a direction in which the second-first electrode extends in the third area of the display area. The first-first trace line may overlap the first-first electrode and might not overlap the second-first electrode in the third area of the display area.

The display device may further include a third input sensor disposed on the display panel and overlapping a third area defined between the first area and the second area of the display area. The third input sensor may include a first-first electrode corresponding to the first electrode, a second-first electrode corresponding to the second electrode and crossing the first-first electrode, a first-first trace line electrically connected to the first-first electrode, a second-first trace line electrically connected to the first-first electrode, and a third-first trace line electrically connected to the second-first electrode. The second-first trace line may overlap the third area of the display area and may extend substantially in the same direction as a direction in which the second-first electrode extends in the third area of the display area. The second-first trace line may overlap the first-first electrode and might not overlap the second-first electrode in the third area of the display area.

The first-first trace line may overlap the first and third areas of the display area and may extend substantially in the same direction as a direction in which the first-first electrode extends in the first area of the display area. The first-first trace line may overlap the first electrode and the second electrode in the first area of the display area, and an overlap area between the first-first trace line and the first electrode may be greater than an overlap area between the first-first trace line and the second electrode in the first area of the display area.

The first input sensor may further include a fourth trace line connected to the second electrode at a point different from a point at which the third trace line is connected to the second electrode, and the third input sensor may further include a fourth-first trace line connected to the second-first electrode at a point different from a point at which the third-first trace line is connected to the second-first electrode.

The first trace line and the second trace line may be branched from a pad connection line at one point in the non-display area, and the pad connection line may be electrically connected to one pad.

A display device includes a first electrode disposed in a first area. A second electrode is disposed in the first area and crosses the first electrode. A first trace line is electrically connected to the first electrode. A second trace line is electrically connected to the first electrode. A third trace line is electrically connected to the second electrode. A first-first electrode is disposed in a second area that is different from the first area. A second-first electrode is disposed in the second area and crosses the first-first electrode. A first-first trace line is electrically connected to the first-first electrode. A second-first trace line is electrically connected to the first-first electrode. A third-first trace line is electrically connected to the second-first electrode. The first electrode and the first-first electrode are separated from each other. The first trace line does not overlap the first area. The second trace line overlaps the first area. The second trace line overlaps the first electrode and does not overlap the second electrode in the first area. The first-first trace line does not overlap the second area. The second-first trace line overlaps the second area. The second-first trace line overlaps the first-first electrode and does not overlap the second-first electrode in the second area.

BRIEF DESCRIPTION OF THE DRAWINGS

The above and other aspects of the present disclosure will become readily apparent by reference to the following detailed description when considered in conjunction with the accompanying drawings wherein:

FIGS. 4A to 4C are enlarged plan views of display areas according to embodiments of the present disclosure;

DETAILED DESCRIPTION

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals may refer to like elements throughout the specification and the drawings. As used herein, the term "and/or" may include any and all combinations of one or more of the associated listed items.

It will be understood that, although the terms first, second, etc. may be used herein to describe various elements, these elements should not necessarily be limited by these terms. These terms are used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

As used herein, the phrase "conductive" is understood to mean "electrically conductive" and the phrase "insulative" is understood to mean "electrically insulative." Similarly, the phrase, "connected" is understood to mean "electrically connected" unless the context clearly indicates a structural connection.

Hereinafter, embodiments of the present disclosure will be described with reference to accompanying drawings.

Figure 1:
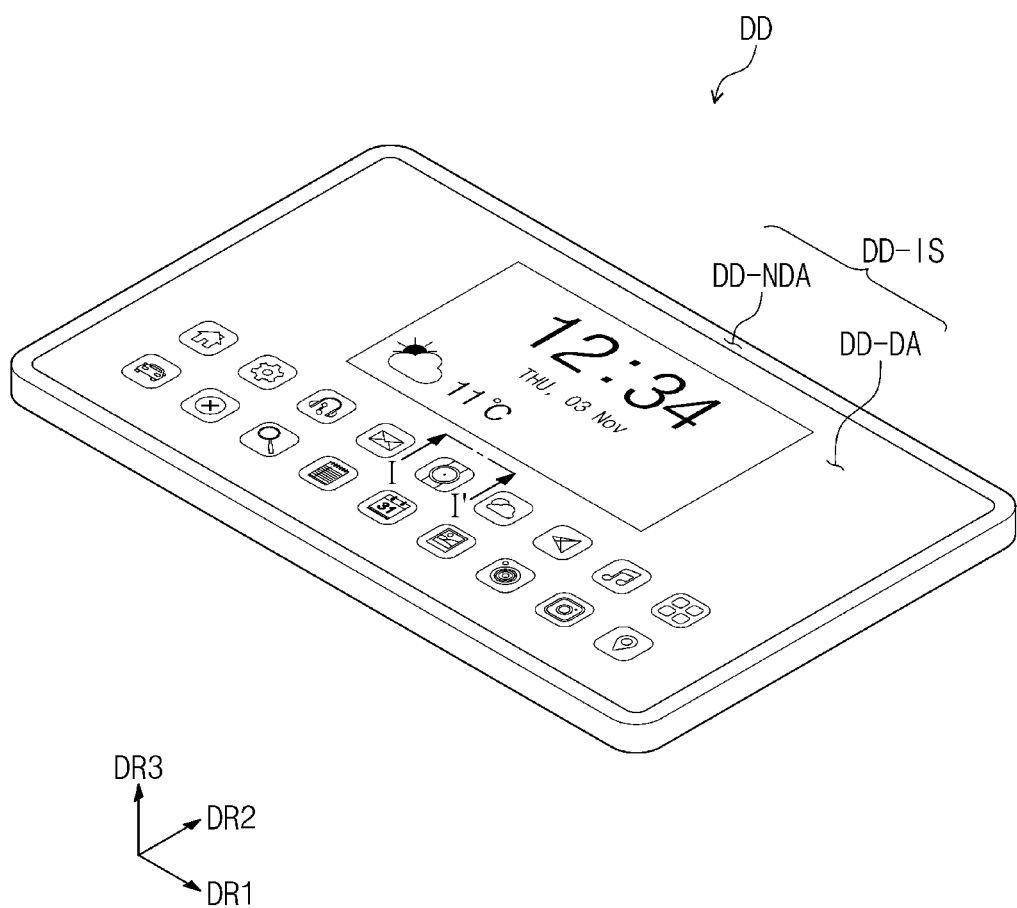
FIG. 1 is a perspective view of a display device according to an embodiment of the present disclosure.

FIG. 1 is a perspective view of a display device DD according to an embodiment of the present disclosure. As shown in FIG. 1, the display device DD may display an image through a display surface DD-IS. The display surface DD-IS may be substantially parallel to a plane defined by a first directional axis DR1 and a second directional axis DR2. A third directional axis DR3 may indicate a normal line direction of the display surface DD-IS, e.g., a thickness direction of the display device DD.

Front (or upper) and rear (or lower) surfaces of each member or each unit described below may be distinguished from each other by the third directional axis DR3. However, directions indicated by the first, second, and third directional axes DR1, DR2, and DR3 are merely examples. First, second, and third directions used hereinafter may be assigned with the same reference numerals as and may indicate the same directions as the first, second, and third directional axes DR1, DR2, and DR3.

In the present embodiment of the present disclosure, the display device DD may include a flat display surface, however, it should not necessarily be limited thereto or thereby. The display device DD may include a curved display surface or a three-dimensional display surface. The three-dimensional display surface may include a plurality of display areas facing different directions from each other, for example, a bent display surface. The display device DD, according to the present embodiment, may be a flexible display device DD that can be bent without sustaining damage thereto. The flexible display device DD may be a foldable display device that can be folded without sustaining damage thereto.

In the present embodiment, the display device DD that may be applied to a tablet computer is illustrated as a representative example. Various electronic modules, a camera module, and a power module, which are mounted on a main board, may be placed on a bracket/a case with the display device DD to form the tablet computer. The display device DD, according to the present disclosure, may be applied to a large-sized electronic item, such as a television set and a computer monitor, and a small and medium-sized electronic item, such as a mobile phone, a vehicle navigation unit, a game console, and a smart watch.

As shown in FIG. 1, the display surface DD-IS may include an image area DD-DA, through which the image is displayed, and a bezel area DD-NDA, defined adjacent to the image area DD-DA. The image is not displayed through the bezel area DD-NDA. FIG. 1 shows images of application icons as a representative example of the image.

As shown in FIG. 1, the image area DD-DA may have a substantially quadrilateral shape. The expression "substantially quadrilateral shape" may mean not only a quadrilateral shape mathematically defined but also a variation of a quadrilateral shape in which a curved line boundary, instead of a vertex, is defined in a vertex area (or a corner area).

The bezel area DD-NDA may fully surround the image area DD-DA, however, it should not necessarily be limited thereto or thereby. The shape of the bezel area DD-NDA may be changed. For example, the bezel area DD-NDA may be defined only at one side of the image area DD-DA or at some but not all sides thereof.

Figure 2:
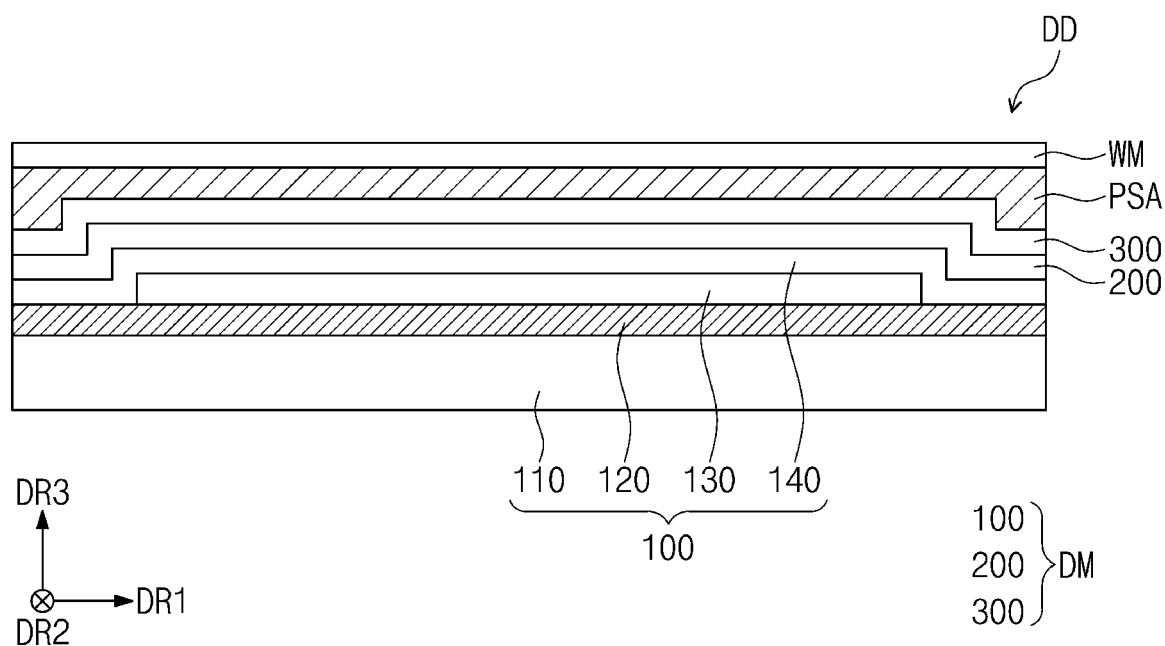
FIG. 2 is a cross-sectional view of a display device according to an embodiment of the present disclosure.

FIG. 2 is a cross-sectional view of the display device DD according to an embodiment of the present disclosure.

The display device DD may include a display module DM and a window WM disposed on the display module DM. The display module DM may be coupled with the window WM by an adhesive layer PSA.

The display module DM may include a display panel 100, an input sensor 200, and an anti-reflective layer 300. The display panel 100 may include a base layer 110, a driving element layer 120, a light emitting element layer 130, and an encapsulation layer 140.

The driving element layer 120 may be disposed on an upper surface of the base layer 110. The base layer 110 may be a flexible substrate that is bendable, foldable, or rollable to an appreciable extent without cracking or otherwise sustaining damage. The base layer 110 may be a glass substrate, a metal substrate, or a polymer substrate, however, it should not necessarily be limited thereto or thereby. According to an embodiment, the base layer 110 may be an inorganic layer, an organic layer, or a composite material layer. The base layer 110 may have substantially the same shape as that of the display panel 100.

The base layer 110 may have a multi-layer structure. For example, the base layer 110 may include a first synthetic resin layer, a second synthetic resin layer, and inorganic layers disposed between the first synthetic resin layer and the second synthetic resin layer. Each of the first and second synthetic resin layers may include a polyimide-based resin, however, it should not necessarily be particularly limited thereto.

The driving element layer 120 may be disposed on the base layer 110. The driving element layer 120 may include a plurality of insulating layers, a plurality of semiconductor patterns, a plurality of conductive patterns, and signal lines. The driving element layer 120 may include a driving circuit for driving a pixel.

The light emitting element layer 130 may be disposed on the driving element layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130, e.g., the light emitting element, from moisture, oxygen, and a foreign substance such as dust particles. The encapsulation layer 140 may include at least one encapsulation inorganic layer. The encapsulation layer 140 may include a stack structure in which a first encapsulation inorganic layer, an encapsulation organic layer, and a second encapsulation inorganic layer are sequentially stacked.

The input sensor 200 may be disposed directly on the display panel 100. The input sensor 200 may sense a user's input (e.g., a touch) by an electromagnetic induction method and/or a capacitive method. The input sensor 200 and the display panel 100 may be formed through successive processes. The expression "A component A is disposed directly on a component B.", as used herein, means that no intervening elements are present between the component A and the component B. For example, a separate adhesive layer might not be disposed between the input sensor 200 and the display panel 100.

The anti-reflective layer 300 may reduce a reflectance with respect to an external light incident thereto from the above of the window WM. The anti-reflective layer 300, according to the present embodiment, may include a retarder and a polarizer. The retarder may be a film type or liquid crystal coating type and may include a λ/2 retarder (e.g., a half-wave plate) and/or a λ/4 retarder (e.g., a quarter-wave plate). The polarizer may be a film type or liquid crystal coating type. The film type retarder and polarizer may include a stretched synthetic resin film, and the liquid crystal coating type retarder and polarizer may include liquid crystals aligned in a predetermined alignment. The retarder and the polarizer may further include a protective film. The retarder and the polarizer themselves or the protective film may be defined as a base layer of the anti-reflective layer 300.

The anti-reflective layer 300 may include color filters. The color filters may be arranged in a predetermined arrangement. As an example, the color filters may be arranged by taking into account colors of lights emitted from pixels included in the display panel 100. The anti-reflective layer 300 may further include a black matrix adjacent to the color filters. The anti-reflective layer 300 including the color filters may be disposed directly on the display panel 100.

According to an embodiment, the window WM may include a base layer and a light blocking pattern. The base layer may include a glass substrate and/or a synthetic resin film. The light blocking pattern may partially overlap the base layer. The light blocking pattern may be disposed on a rear surface of the base layer, and the light blocking pattern may substantially define the bezel area DD-NDA (refer to FIG. 1) of the display device DD. An area in which the light blocking pattern is not disposed may define the image area DD-DA (refer to FIG. 1) of the display device DD.

Figure 3:
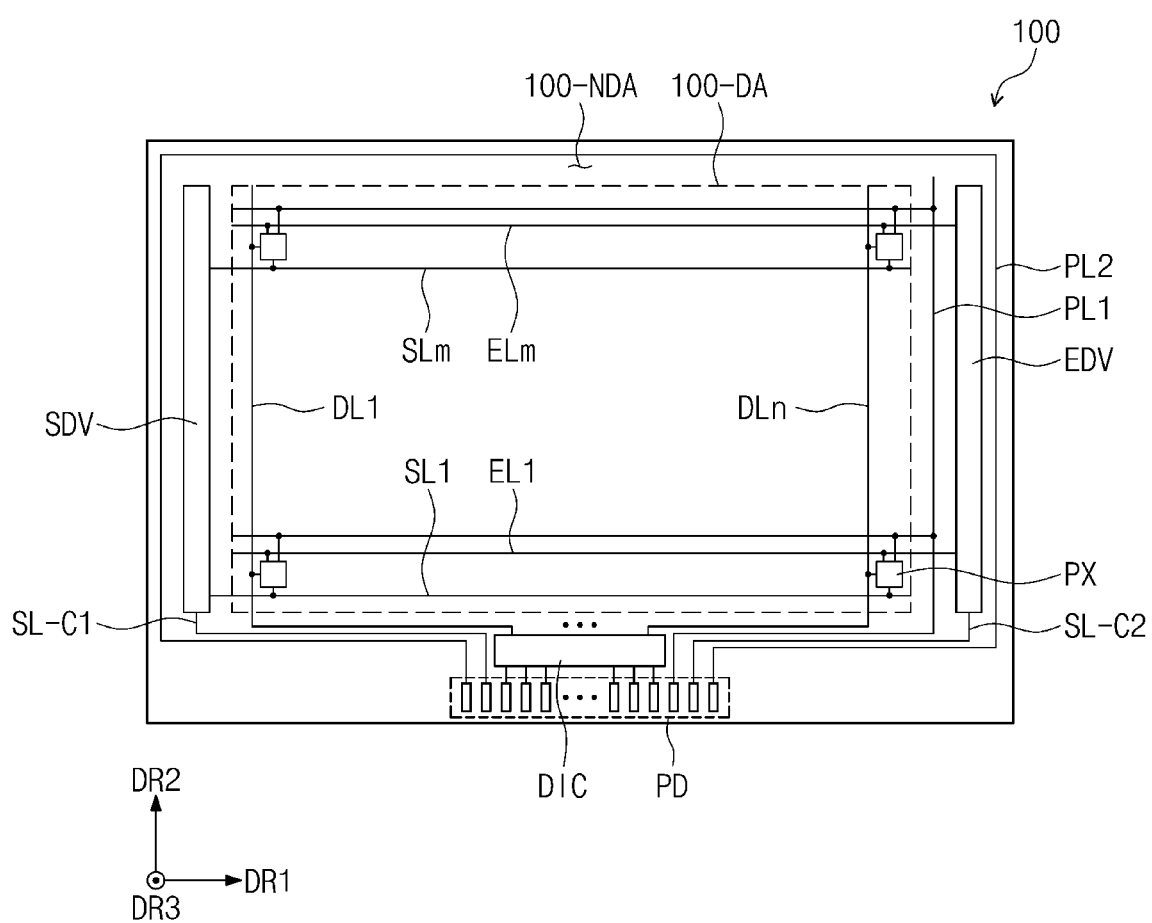
FIG. 3 is a plan view of a display panel according to an embodiment of the present disclosure.

FIG. 3 is a plan view of the display panel 100 according to an embodiment of the present disclosure.

Referring to FIG. 3, the display panel 100 may include a plurality of pixels PX, a scan driver SDV, a light emission driver EDV, a plurality of signal lines, and a plurality of pads PD. The pixels PX may be arranged in a display area 100-DA. A driving chip DIC disposed in a non-display area 100-NDA may include a data driver. The display area 100-DA may correspond to the image area DD-DA of FIG. 1, and the non-display area 100-NDA may correspond to the bezel area DD-NDA. In the following descriptions, the expression "An area/portion corresponds to another area/portion." means that "An area/portion overlaps another area/portion.", but the expression should not necessarily be limited to meaning "An area/portion has the same area and/or the same shape as another area/portion". According to an embodiment, the data driver may be integrated into the display panel 100 like the scan driver SDV and the light emission driver EDV.

The signal lines may include a plurality of scan lines SL1 to SLm, a plurality of data lines DL1 to DLn, a plurality of light emission lines EL1 to ELm, first and second control lines SL-C1 and SL-C2, and first and second power lines PL1 and PL2. Here, "m" and "n" are integers equal to or greater than 2.

The scan lines SL1 to SLm may extend in the first direction DR1 and may be electrically connected to the pixels PX and the scan driver SDV. The data lines DL1 to DLn may extend in the second direction DR2 and may be electrically connected to the pixels PX and the driving chip DIC. The light emission lines EL1 to Elm may extend in the first direction DR1 and may be electrically connected to the pixels PX and the light emission driver EDV.

The first power line PL1 may receive a first power supply voltage, and the second power line PL2 may receive a second power supply voltage having a voltage level that is lower than that of the first power supply voltage. A second electrode of the light emitting element, for example, a cathode, may be connected to the second power line PL2.

The first control line SL-C1 may be connected to the scan driver SDV and may extend toward a lower end of the display panel 100. The second control line SL-C2 may be connected to the light emission driver EDV and may extend toward the lower end of the display panel 100. The pads PD may be disposed in the non-display area 100-NDA adjacent to the lower end of the display panel 100 and may be closer to the lower end of the display panel 100 than the driving chip DIC is. The pads PD may be connected to the driving chip DIC and some of the signal lines.

The scan driver SDV may generate a plurality of scan signals, and the scan signals may be applied to the pixels PX via the scan lines SL1 to SLm. The driving chip DIC may generate a plurality of data voltages, and the data voltages may be applied to the pixels PX via the data lines DL1 to DLn. The light emission driver EDV may generate a plurality of light emission signals, and the light emission signals may be applied to the pixels PX via the light emission lines EL1 to ELm. The pixels PX may receive the data voltages in response to the scan signals. The pixels PX may emit light with luminance corresponding to the data voltages in response to the light emission signals to display the image.

Figure 4A:
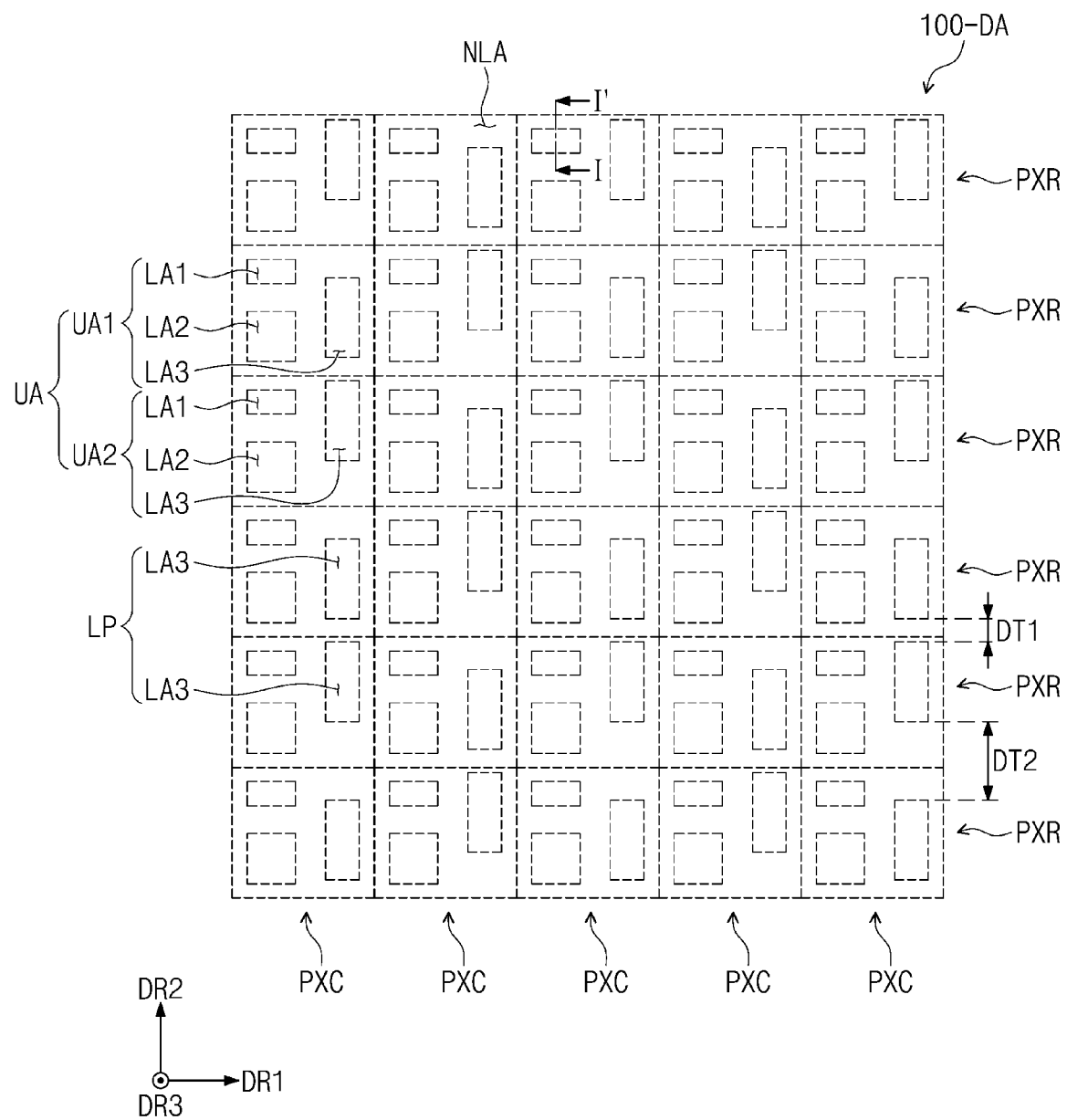
Figure 4B:
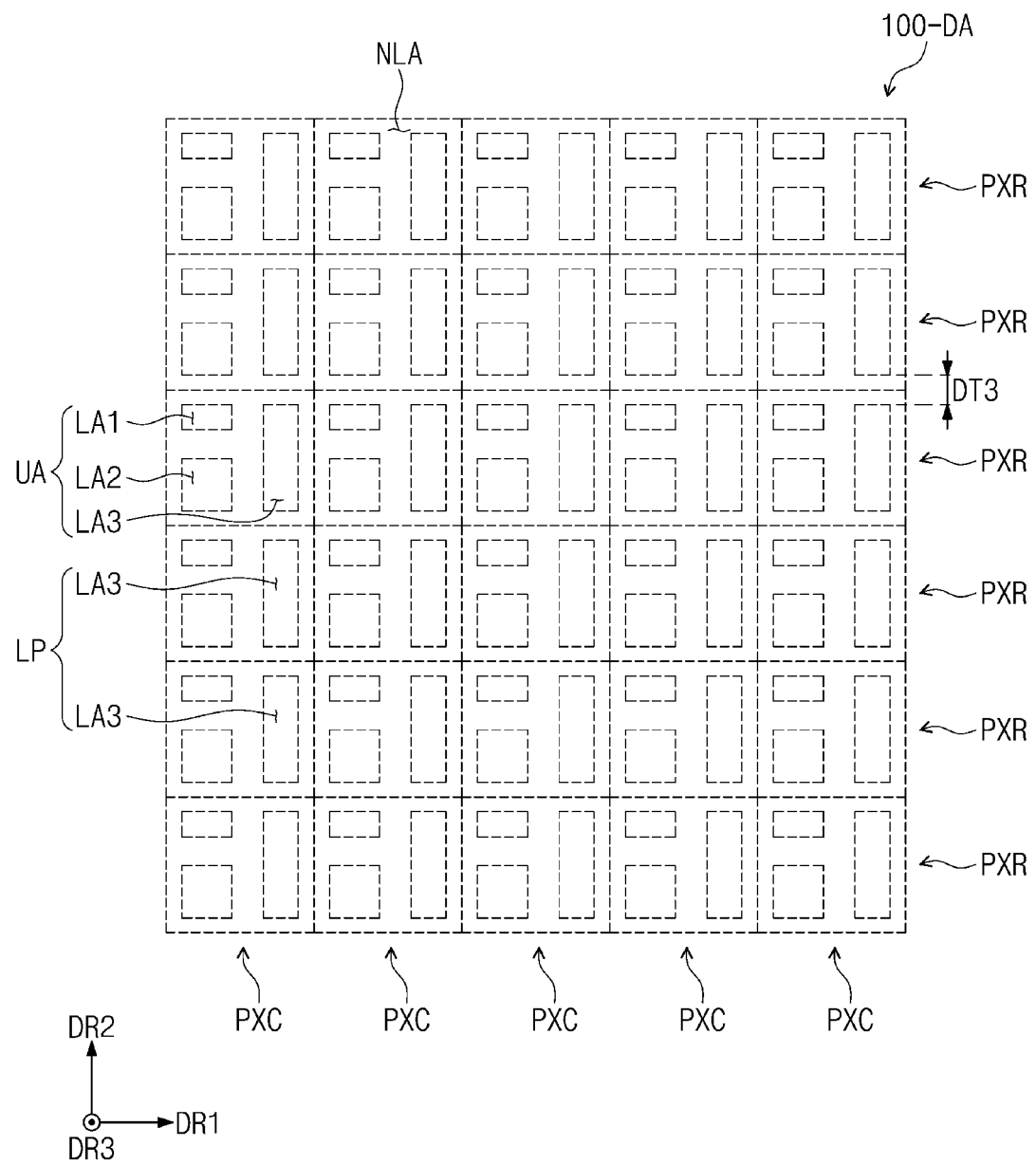

FIGS. 4A to 4C are enlarged plan views of display areas according to embodiments of the present disclosure.

Referring to FIG. 4A, the display area 100-DA may include a plurality of light emitting areas LA1, LA2, and LA3 and a non-light-emitting area NLA adjacent to the light emitting areas LA1, LA2, and LA3. The non-light-emitting area NLA may define a boundary between the light emitting areas LA1, LA2, and LA3.

The light emitting areas LA1, LA2, and LA3 may correspond to the pixels PX of FIG. 3 in a one-to-one correspondence. Each of the pixels PX may include the light emitting element, and the light emitting areas LA1, LA2, and LA3 may be areas from which the light emitted from the light emitting element exits. An arrangement relationship between the light emitting areas LA1, LA2, and LA3 and the non-light-emitting area NLA will be described later with reference to FIG. 5.

The light emitting areas LA1, LA2, and LA3 may include a first light emitting area LA1 (or a first color light emitting area) forming a first color light, a second light emitting area LA2 (or a second color light emitting area) forming a second color light, and a third light emitting area LA3 (or a third color light emitting area) forming a third color light. In the present embodiment, the first color light may be a red light, the second color light may be a green light, and the third color light may be a blue light.

The first light emitting area LA1, the second light emitting area LA2, and the third light emitting area LA3 may have sizes that are different from each other, however, they should not necessarily be limited thereto or thereby. In the present embodiment, the first light emitting area LA1 may have the smallest size, and the third light emitting area LA3 may have the largest size.

The first light emitting area LA1, the second light emitting area LA2, and the third light emitting area LA3 may define one unit light emitting area UA. The unit light emitting area UA is a unit that is repeated for the arrangement of the light emitting areas defined in the display area 100-DA. In the present embodiment, the unit light emitting area UA may include a first unit light emitting area UA1 and a second unit light emitting area UA2.

Referring to the first unit light emitting area UA1 and the second unit light emitting area UA2, the first light emitting area LA1 and the second light emitting area LA2 may be disposed at one side (e.g., a left side in FIG. 4A) of the third light emitting area LA3 in the first direction DR1. The second light emitting area LA2 of each of the first unit light emitting area UA1 and the second unit light emitting area UA2 may be disposed at one side (e.g., a lower side in FIG. 4A) of the first light emitting area LA1.

A position of the third light emitting area LA3 of the first unit light emitting area UA1 with respect to the first light emitting area LA1 and the second light emitting area LA2 in the second direction DR2 may be different from a position of the third light emitting area LA3 of the second unit light emitting area UA2 with respect to the first light emitting area LA1 and the second light emitting area LA2 in the second direction DR2. The position of third light emitting area LA3 of the first unit light emitting area UA1 with respect to the first light emitting area LA1 and the second light emitting area LA2 in the second direction DR2 may be located at a lower side. The position of the third light emitting area LA3 of the second unit light emitting area UA2 with respect to the first light emitting area LA1 and the second light emitting area LA2 in the second direction DR2 may be located at an upper side. A degree of shift of the third light emitting area LA3 of the first unit light emitting area UA1 with respect to the first light emitting area LA1 and the second light emitting area LA2 in the second direction DR2 may be different from a degree of shift of the third light emitting area LA3 of the second unit light emitting area UA2 with respect to the first light emitting area LA1 and the second light emitting area LA2 in the second direction DR2. In the present embodiment, the third light emitting area LA3 of the second unit light emitting area UA2 may be shifted further.

The first unit light emitting area UA1 may be alternately arranged with the second unit light emitting area UA2 along the first direction DR1 in a pixel row PXR. The first unit light emitting area UA1 may be alternately arranged with the second unit light emitting area UA2 along the second direction DR2 in a pixel column PXC. Due to the arrangement of the first unit light emitting area UA1 and the second unit light emitting area UA2, the third light emitting area LA3 of the first unit light emitting area UA1 and the third light emitting area LA3 of the second unit light emitting area UA2 may be arranged in a specific rule. The third light emitting area LA3 of the first unit light emitting area UA1 and the third light emitting area LA3 of the second unit light emitting area UA2 adjacent to the first unit light emitting area UA1 may be spaced apart from each other by a first distance DT1. The third light emitting area LA3 of the first unit light emitting area UA1 and the third light emitting area LA3 of the second unit light emitting area UA2, which are spaced apart from each other by the first distance DT1, may define a light emitting area pair LP. The light emitting area pair LP may be spaced apart from another light emitting area pair LP by a second distance DT2 in each pixel column PXC. The second distance DT2 may be greater than the first distance DT1.

The light emitting area pair LP is formed because of the mask used during a deposition process. The light emitting element disposed in the third light emitting area LA3 of the first unit light emitting area UA1 and the light emitting element disposed in the third light emitting area LA3 of the second unit light emitting area UA2 may include a light emitting layer having a single integral form. For example, the light emitting layer disposed in the third light emitting area LA3 of the first unit light emitting area UA1 and the light emitting layer disposed in the third light emitting area LA3 of the second unit light emitting area UA2 may be provided integrally with each other and may be deposited using one mask. The mask may be provided with openings defined therethrough to correspond the light emitting area pairs LP. An area between the openings of the mask may correspond to a blocking area of the mask. As the openings corresponding to the light emitting area pairs LP are defined, the number of the openings may be reduced, and a width of the blocking area of the mask disposed between the openings in the second direction DR2 may be secured. Thin film masks may be used to secure the width of the blocking area thereof in the second direction DR2 to prevent defects of the mask, e.g., sagging, during the deposition process.

This may be understood by comparing a third distance DT3 between third light emitting areas LA3 shown in FIG. 4B. Referring to FIG. 4B, unit light emitting areas UA disposed in the display area 100-DA belong to one type. The third distance DT3 between the third light emitting areas LA3 of the unit light emitting areas UA adjacent to each other in a pixel column PXC may be smaller than the second distance DT2 of FIG. 4A. The number of openings defined through a mask used to form the third light emitting areas LA3 of FIG. 4B is greater than that of the mask used to form the third light emitting areas LA3 of FIG. 4A, and a width of a blocking area of the mask is reduced.

Referring to FIG. 4C, unit light emitting areas UA0 disposed in the display area 100-DA belong to one type. The unit light emitting area UA0 may include second light emitting areas LA2 disposed spaced apart from each other in the first direction DR1 and a first light emitting area LA1 and a third light emitting area LA3 disposed spaced apart from each other in the second direction DR2. Four light emitting areas LA1, LA2, and LA3 of the unit light emitting area UA0 may be arranged in a lozenge (e.g., diamond) shape. The unit light emitting areas UA0 of pixel rows PXR may be arranged in the first direction DR1. The unit light emitting areas UA0 of the pixel rows PXR adjacent to each other may be arranged staggered with each other along the first direction DR1. The unit light emitting areas UA0 of pixel columns PXC adjacent to each other may be arranged staggered with each other along the second direction DR2.

Figure 5:
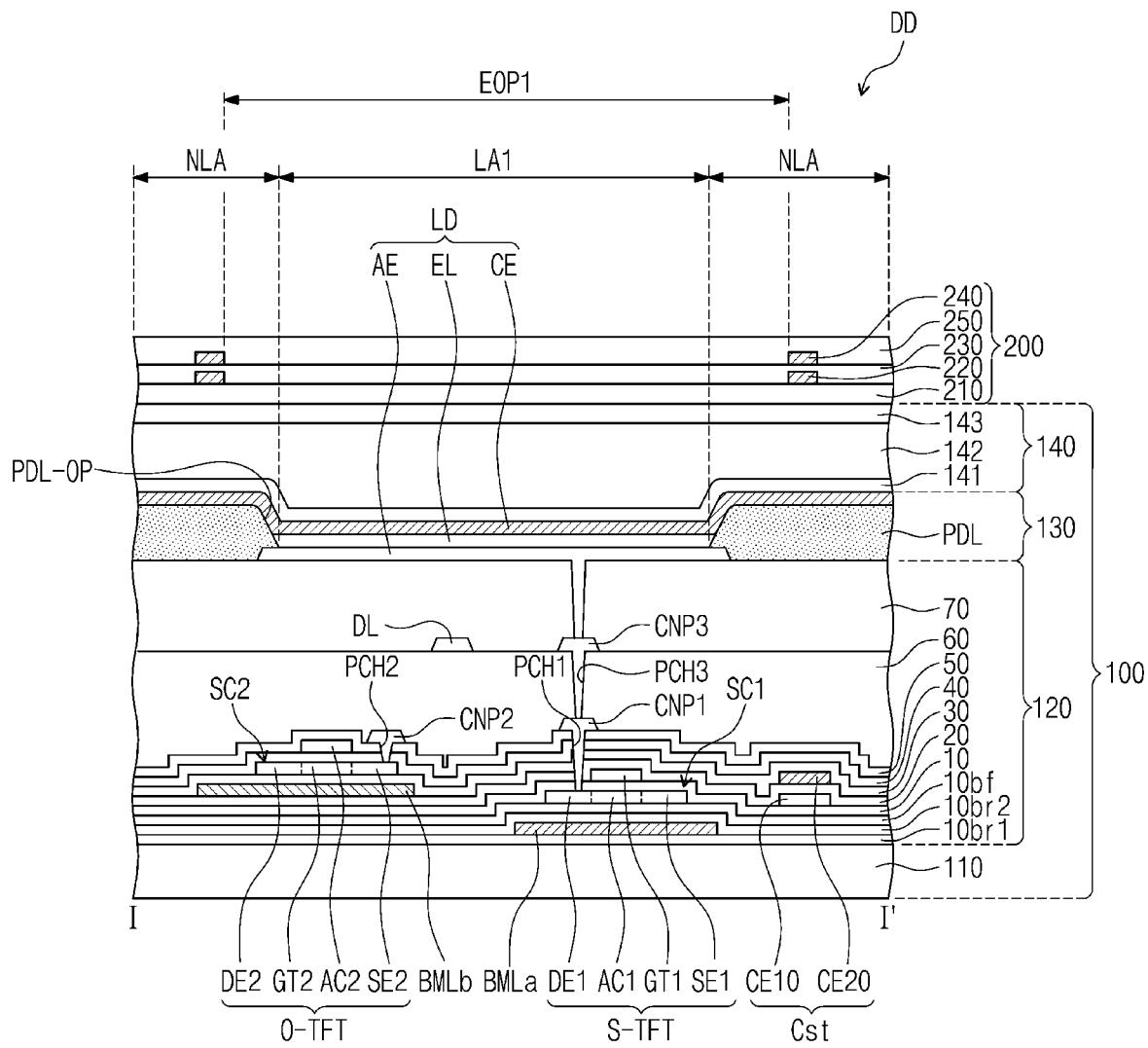
FIG. 5 is a cross-sectional view of a display device taken along a line I-I' of FIG. 4A.

FIG. 5 is a cross-sectional view of the display device DD taken along a line I-I' of FIG. 4A. In FIG. 5, some components of the display device DD, for example, the anti-reflective layer 300 to the window WM of FIG. 2, are not shown.

A pixel driving circuit PC that drives the light emitting element LD may include a plurality of pixel driving elements. The pixel driving circuit PC may include a plurality of transistors S-TFT and O-TFT and a capacitor Cst. FIG. 5 shows a silicon transistor S-TFT and an oxide transistor O-TFT as a representative example of the transistor. The pixel driving circuit PC of FIG. 5 is an example, and components of the pixel driving circuit PC should not necessarily be limited thereto or thereby. The pixel driving circuit PC may include only one type of transistor of the silicon transistor S-TFT and the oxide transistor O-TFT.

Referring to FIG. 5, the base layer 110 has a single-layer structure. The base layer 110 may include a synthetic resin such as polyimide. The base layer 110 may be formed by coating a synthetic resin layer on a work substrate (or a carrier substrate). When the display module DM is completed through subsequent processes, the work substrate may be removed.

Referring to FIG. 5, a barrier layer 10br may be disposed on the base layer 110. The barrier layer 10br may prevent a foreign substance from entering thereinto from the outside. The barrier layer 10br may include at least one inorganic layer. The barrier layer 10br may include a silicon oxide layer and a silicon nitride layer. Each of the silicon oxide layer and the silicon nitride layer may be provided in plural, and the silicon oxide layers and the silicon nitride layers may be alternately stacked with each other.

The barrier layer 10br may include a lower barrier layer 10br1 and an upper barrier layer 10br2. A first shielding electrode BMLa may be disposed between the lower barrier layer 10br1 and the upper barrier layer 10br2. The first shielding electrode BMLa may correspond to the silicon transistor S-TFT. The first shielding electrode BMLa may include a metal material, e.g., molybdenum.

The first shielding electrode BMLa may receive a bias voltage. The first shielding electrode BMLa may receive the first power supply voltage. The first shielding electrode BMLa may prevent an electric potential caused by a polarization phenomenon from exerting influence on the silicon transistor S-TFT. The first shielding electrode BMLa may prevent an external light from reaching the silicon transistor S-TFT. According to an embodiment, the first shielding electrode BMLa may be a floating electrode isolated from other electrodes or lines.

A buffer layer 10bf may be disposed on the barrier layer 10br. The buffer layer 10bf may prevent metal atoms or impurities from being diffused to a first semiconductor pattern SC1 disposed thereon from the base layer 110. The buffer layer 10bf may include at least one inorganic layer. The buffer layer 10bf may include a silicon oxide layer and a silicon nitride layer.

The first semiconductor pattern SC1 may be disposed on the buffer layer 10bf. The first semiconductor pattern SC1 may include a silicon semiconductor. As an example, the silicon semiconductor may include amorphous silicon or polycrystalline silicon. For example, the first semiconductor pattern SC1 may include low temperature polycrystalline silicon.

The first semiconductor pattern SC1 may have different electrical properties depending on whether or not it is doped or whether it is doped with an N-type dopant or a P-type dopant. The first semiconductor pattern SC1 may include a first region having a relatively high conductivity and a second region having a relatively low conductivity. The first region may be doped with the N-type dopant or the P-type dopant. The second region may be a non-doped region or a region doped at a concentration lower than that of the first region. A source area SE1, a channel area AC1 (or an active area), and a drain area DE1 of the silicon transistor S-TFT may be formed from the first semiconductor pattern SC1. The source area SE1 and the drain area DE1 may extend in opposite directions to each other from the channel area AC1 in a cross-section.

A first insulating layer 10 may be disposed on the buffer layer 10bf. The first insulating layer 10 may cover the first semiconductor pattern SC1. The first insulating layer 10 may be an inorganic layer. The first insulating layer 10 may have a single-layer structure of a silicon oxide layer, however, it should not necessarily be limited thereto or thereby. Not only the first insulating layer 10, but also an insulating layer of the driving element layer 120 described later may have a single-layer or multi-layer structure and may include at least one of a silicon oxide, a silicon nitride or a silicon oxy nitride, however, it should not necessarily be limited thereto or thereby.

A gate GT1 of the silicon transistor S-TFT may be disposed on the first insulating layer 10. The gate GT1 may be a portion of a metal pattern. The gate GT1 may overlap the channel area AC1. The gate GT1 may be used as a mask in a process of doping the first semiconductor pattern SC1. A first electrode CE10 of the capacitor Cst may be disposed on the first insulating layer 10. Different from the display device DD shown in FIG. 5, the gate GT1 and the first electrode CE10 may be provided integrally with each other.

A second insulating layer 20 may be disposed on the first insulating layer 10 and may cover the gate GT1. An upper electrode may be further disposed on the second insulating layer 20 and may overlap the gate GT1. A second electrode CE20 may be disposed on the second insulating layer 20 and may overlap the first electrode CE10. The upper electrode may be provided integrally with the second electrode CE20, in a plan view.

A second shielding electrode BMLb may be disposed on the second insulating layer 20. The second shielding electrode BMLb may correspond to the oxide transistor O-TFT. According to an embodiment, the second shielding electrode BMLb may be omitted. According to an embodiment, the first shielding electrode BMLa may extend to a lower portion of the oxide transistor O-TFT and may replace the second shielding electrode BMLb.

A third insulating layer 30 may be disposed on the second insulating layer 20. A second semiconductor pattern SC2 may be disposed on the third insulating layer 30. The second semiconductor pattern SC2 may include a channel area AC2 of the oxide transistor O-TFT. The second semiconductor pattern SC2 may include a metal oxide semiconductor. The second semiconductor pattern SC2 may include a transparent conductive oxide (TCO), such as indium tin oxide (ITO), indium zinc oxide (IZO), indium gallium zinc oxide (IGZO), zinc oxide (ZnOx), or indium oxide (In$_2$O$_3$).

The metal oxide semiconductor may include a plurality of areas SE2, AC2, and DE2 distinguished from each other depending on whether or not a transparent conductive oxide is reduced. The area (hereinafter, referred to as a reduced area) in which the transparent conductive oxide is reduced has a conductivity that is greater than that of the area (hereinafter, referred to as a non-reduced area) in which the transparent conductive oxide is not reduced. The reduced area may substantially act as the source/drain of the transistor or the signal line. The non-reduced area may substantially correspond to the semiconductor area (or the channel) of the transistor. A fourth insulating layer 40 may be disposed on the third insulating layer 30. As shown in FIG. 5, the fourth insulating layer 40 may cover the second semiconductor pattern SC2. According to an embodiment, the fourth insulating layer 40 may be an insulating pattern that overlaps a gate GT2 of the oxide transistor O-TFT and exposes a source area SE2 and a drain area DE2.

The gate GT2 of the oxide transistor O-TFT may be disposed on the fourth insulating layer 40. The gate GT2 of the oxide transistor O-TFT may be a portion of a metal pattern. The gate GT2 of the oxide transistor O-TFT may overlap the channel area AC2. A fifth insulating layer 50 may be disposed on the fourth insulating layer 40 and may cover the gate GT2. Each of the first to fifth insulating layers 10 to 50 may be an inorganic layer.

A first connection pattern CNP1 and a second connection pattern CNP2 may be disposed on the fifth insulating layer 50. The first connection pattern CNP1 and the second connection pattern CNP2 may be formed through a same process, and thus, the first connection pattern CNP1 and the second connection pattern CNP2 may include a same material and a same stack structure. The first connection pattern CNP1 may be connected to the drain area DE1 of the silicon transistor S-TFT via a first pixel contact hole PCH1 defined through the first, second, third, fourth, and fifth insulating layers 10, 20, 30, 40, and 50. The second connection pattern CNP2 may be connected to the source area SE2 of the oxide transistor O-TFT via a second pixel contact hole PGH2 defined through the fourth and fifth insulating layers 40 and 50. The connection relationship of the first connection pattern CNP1 and the second connection pattern CNP2 with respect to the silicon transistor S-TFT and the oxide transistor O-TFT should not necessarily be limited thereto or thereby.

A sixth insulating layer 60 may be disposed on the fifth insulating layer 50. A third connection pattern CNP3 may be disposed on the sixth insulating layer 60. The third connection pattern CNP3 may be connected to the first connection pattern CNP1 via a third pixel contact hole PCH3 defined through the sixth insulating layer 60. A data line DL may be disposed on the sixth insulating layer 60. A seventh insulating layer 70 may be disposed on the sixth insulating layer 60 and may cover the third connection pattern CNP3 and the data line DL. The third connection pattern CNP3 and the data line DL may be formed through the same process, and thus, the third connection pattern CNP3 and the data line DL may include the same material and the same stack structure. Each of the sixth insulating layer 60 and the seventh insulating layer 70 may be an organic layer.

The light emitting element LD may include an anode AE (or a first electrode), a light emitting layer EL, and a cathode CE (or a second electrode). The anode AE of the light emitting element LD may be disposed on the seventh insulating layer 70. The anode AE may be a (semi-)transmissive electrode or a reflective electrode. The anode AE may have a stack structure of ITO/Ag/ITO. Positions of the anode AE and the cathode CE may be interchanged.

A pixel definition layer PDL may be disposed on the seventh insulating layer 70. The pixel definition layer PDL may be an organic layer. The pixel definition layer PDL may have a light absorbing property and may have a black color. As an example, the pixel definition layer PDL may include a black coloring agent. The black coloring agent may include a black dye or a black pigment. The black coloring agent may include a metal material, such as carbon black, chromium, or an oxide thereof. The pixel definition layer PDL may correspond to a light blocking pattern having a light blocking property.

The pixel definition layer PDL may cover a portion of the anode AE. As an example, an opening PDL-OP may be defined through the pixel definition layer PDL to expose a portion of the anode AE. The light emitting area LA1 may be defined to correspond to the opening PDL-OP. FIG. 5 shows one light emitting area LA1 corresponding to the first light emitting area LA1 of FIG. 4A. A cross-section corresponding to the second light emitting area LA2 and the third light emitting area LA3 of FIG. 4A may be substantially the same as that of FIG. 5. However, the light emitting layer EL of each of the second light emitting area LA2 and the third light emitting layer LA3 may include a material that is different from a light emitting material included in the light emitting layer EL of the first light emitting layer LAL In addition, referring to the light emitting area pair LP of FIG. 4A, the pixel definition layer PDL may be disposed between the third light emitting area LA3 of the first unit light emitting area UA1 and the third light emitting area LA3 of the second unit light emitting area UA2. The light emitting layer EL disposed in the third light emitting area LA3 of the first unit light emitting area UA1 and the third light emitting area LA3 of the second unit light emitting area UA2 may be disposed on the pixel definition layer PDL disposed between the third light emitting area LA3 of the first unit light emitting area UA1 and the third light emitting area LA3 of the second unit light emitting area UA2.

In the present disclosure, a hole control layer may be disposed between the anode AE and the light emitting layer EL. The hole control layer may include a hole transport layer and may further include a hole injection layer. An electron control layer may be disposed between the light emitting layer EL and the cathode CE. The electron control layer may include an electron transport layer and may further include an electron injection layer.

The encapsulation layer 140 may cover the light emitting element LD. The encapsulation layer 140 may include an encapsulation inorganic layer 141, an encapsulation organic layer 142, and an encapsulation inorganic layer 143, which are sequentially stacked, however, layers forming the encapsulation layer 140 should not necessarily be limited thereto or thereby. The encapsulation inorganic layers 141 and 143 may include a silicon nitride layer, a silicon oxynitride layer, a silicon oxide layer, a titanium oxide layer, or an aluminum oxide layer. Each of the encapsulation inorganic layers 141 and 143 may have a multi-layer structure. The encapsulation organic layer 142 may include an acrylic-based organic layer, however, it should not necessarily be particularly limited thereto.

The input sensor 200 may include at least one conductive layer (or at least one sensor conductive layer) and at least one insulating layer (or at least one sensor insulation layer). In the present embodiment, the input sensor 200 may include a first insulating layer 210 (or a first sensor insulation layer), a first conductive layer 220 (or a first sensor conductive layer), a second insulating layer 230 (or a second sensor insulation layer), a second conductive layer 240 (or a second sensor conductive layer), and a third insulating layer 250 (or a third sensor insulation layer). FIG. 5 schematically shows a conductive line of the first conductive layer 220 and a conductive line of the second conductive layer 240.

The first insulating layer 210 may be disposed directly on the display panel 100. The first insulating layer 210 may be an inorganic layer including a silicon nitride, a silicon oxynitride, and/or a silicon oxide. Each of the first conductive layer 220 and the second conductive layer 240 may have a single-layer structure or a multi-layer structure of layers stacked in the third direction DR3. The first conductive layer 220 and the second conductive layer 240 may include conductive lines that define a mesh shape. The conductive line of the first conductive layer 220 and the conductive line of the second conductive layer 240 may be connected to each other via a contact hole defined through the second insulating layer 230 or might not be connected to each other depending on their positions.

The first conductive layer 220 and the second conductive layer 240, which have the single-layer structure, may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as PEDOT, metal nanowire, graphene, or the like.

The first conductive layer 220 and the second conductive layer 240, which have the multi-layer structure, may include metal layers. The metal layers may have a three-layer structure of titanium/aluminum/titanium. The first conductive layer 220 and the second conductive layer 240, which have the multi-layer structure, may include at least one metal layer and at least one transparent conductive layer. The second insulating layer 230 may be disposed between the first conductive layer 220 and the second conductive layer 240. The third insulating layer 250 may cover the second conductive layer 240. According to an embodiment, the third insulating layer 250 may be omitted. The second insulating layer 230 and the third insulating layer 250 may include an inorganic layer or an organic layer.

Figure 6:
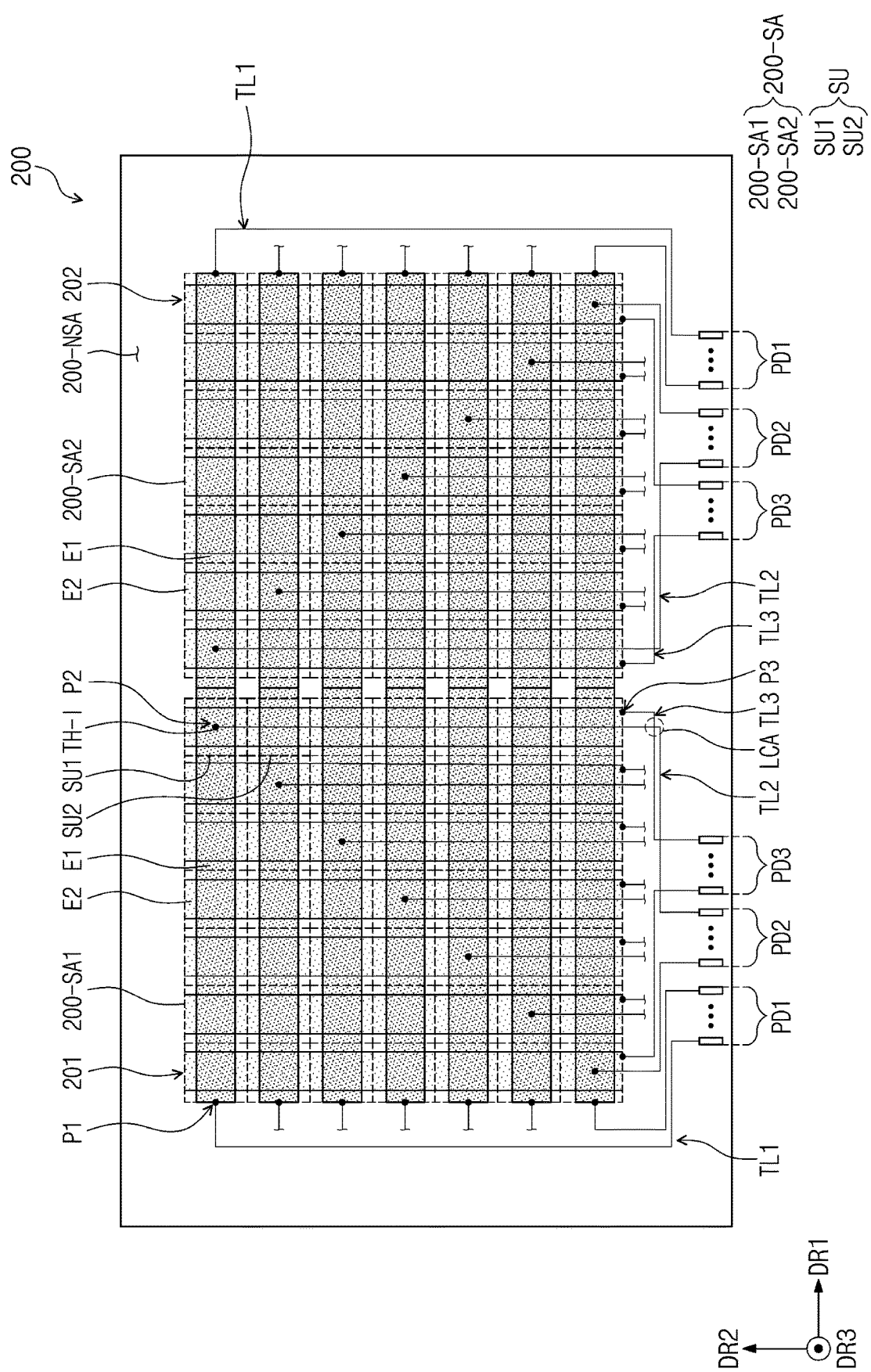
FIG. 6 is a plan view of an input sensor according to an embodiment of the present disclosure.
Figure 7:
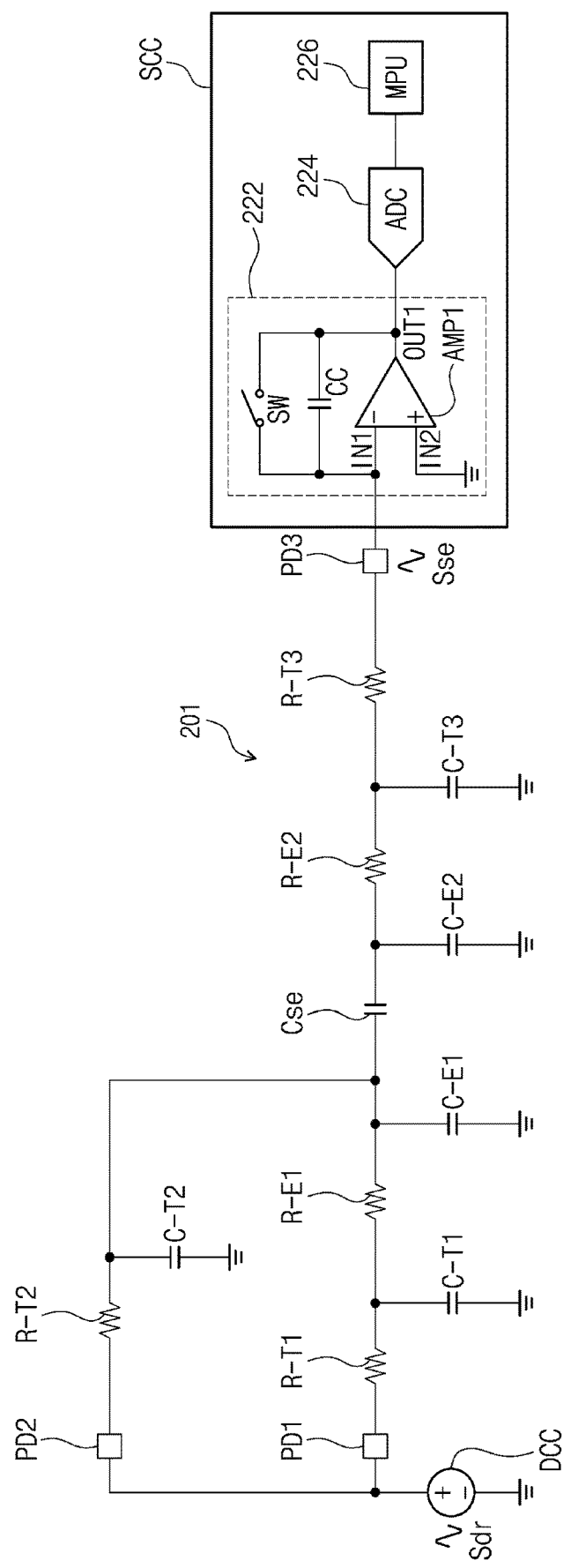
FIG. 7 is an equivalent circuit diagram of an input sensor according to an embodiment of the present disclosure.

FIG. 6 is a plan view of the input sensor 200 according to an embodiment of the present disclosure, and FIG. 7 is an equivalent circuit diagram of the input sensor 200 according to an embodiment of the present disclosure.

The input sensor 200 may include a sensing area 200-SA and a non-sensing area 200-NSA. The sensing area 200-SA may correspond to the display area 100-DA of FIG. 3, and the non-sensing area 200-NSA may correspond to the non-display area 100-NDA of FIG. 3. According to an embodiment, the sensing area 200-SA and the display area 100-DA may have a same size, and the non-sensing area 200-NSA and the non-display area 100-NDA may have a same size.

The input sensor 200 may include a first input sensor 201 and a second input sensor 202. The first input sensor 201 and the second input sensor 202 may be respectively disposed in a first sensing area 200-SA1 and a second sensing area 200-SA2 of the sensing area 200-SA. The first sensing area 200-SA1 may overlap a first area of the display area 100-DA, and the second sensing area 200-SA2 may overlap a second area of the display area 100-DA.

The first input sensor 201 and the second input sensor 202 may have substantially the same structure as each other. In the present embodiment, the first input sensor 201 and the second input sensor 202 are arranged symmetrically at left and right sides as a representative example, however, they should not necessarily be limited thereto or thereby. Hereinafter, descriptions of the input sensor 200 will be mainly focused on the first input sensor 201.

The first input sensor 201 may include a first sensing electrode E1 (hereinafter, referred to as a first electrode) and a second sensing electrode E2 (hereinafter, referred to as a second electrode) crossing the first sensing electrode E1. As the plural input sensors 201 and 202 are disposed in the sensing area 200-SA, a length of at least one of the first electrode E1 and the second electrode E2 may be reduced. This may cause a reduction in resistance of electrodes and a reduction in load of the input sensor 200. For example, when one first sensing electrode E1 extending in the first direction DR1 is commonly disposed in the first sensing area 200-SA1 and the second sensing area 200-SA2, the resistance of the first sensing electrode E1 may significantly increase. The first input sensor 201 and the second input sensor 202 may be driven synchronously with each other or driven independently of each other.

The first electrode E1 may be provided in plural, and the second electrode E2 may be provided in plural. The first electrodes E1 may extend substantially in the first direction DR1 and may be arranged in the second direction DR2. The expression "The first electrodes E1 are substantially extended in the first direction DR1" not only means that the first electrodes extend in a straight line in the first direction DR1 but also means that one ends and the other ends of the first electrodes are disposed spaced apart from each other in the first direction DR1. The second electrodes E2 may extend substantially in the second direction DR2 and may be arranged in the first direction DR1.

A sensing unit SU may be defined for each intersection area where the first electrodes E1 intersect the second electrodes E2. The first sensing area 200-SA1 of FIG. 6 may include a plurality of sensing units SU arranged in a matrix form, however, the sensing units SU might not necessarily be the same as one another. Some of the sensing units SU may have a relatively small size. For example, the sensing units SU placed at corners of the sensing area 200-SA may have a relatively small size. This is because the display area 100-DA and the sensing area 200-SA may have rounded corners. In addition, an opening through which a light passes may be formed in a specific sensing area 200-SA.

The first input sensor 201 may include a first trace line TL1 electrically connected to the first electrode E1, a second trace line TL2 electrically connected to the first electrode E1, and a third trace line TL3 electrically connected to the second electrode E2. One end of the first trace line TL1 may be connected to the first electrode E1 at a first point P1, one end of the second trace line TL2 may be connected to the first electrode E1 at a second point P2, and one end of the third trace line TL3 may be connected to the second electrode E2 at a third point P3. The other end of the first trace line TL1 may be connected to a first pad PD1, the other end of the second trace line TL2 may be connected to a second pad PD2, and the other end of the third trace line TL3 may be connected to a third pad PD3. Each of the first pad PD1 to the third pad PD3 may be a conductive pattern disposed on a layer different from a layer on which at least a portion of the trace line is disposed.

The first trace line TL1 and the second trace line TL2 may be connected to different points of the first electrode E1, and each of the first trace line TL1 and the second trace line TL2 may be provided in plural to correspond to the first electrodes E1. The third trace line TL3 may be provided in plural to correspond to the second electrodes E2. Hereinafter, a structure in which two trace lines are connected to one electrode such as the first electrode E1 may be referred to as a double-routing structure. A structure in which one trace line is connected to one electrode such as the second electrode E2 may be referred to as a single-routing structure.

One electrode of the first electrode E1 and the second electrode E2 may receive a driving signal. Current may flow from one electrode of the first electrode E1 and the second electrode E2 to the other electrode of the first electrode E1 and the second electrode E2 via a mutual capacitor defined between the first electrode E1 and the second electrode E2. Only one of the first electrode E1 and the second electrode E2 may receive the driving signal, however it should not necessarily be limited thereto or thereby. According to an embodiment, the first electrode E1 may receive the driving signal in a first period, and the second electrode E2 may receive the driving signal in a second period. In the present embodiment, the first electrode E1 will be described as receiving the driving signal, however, the second electrode E2 may receive the driving signal.

FIG. 6 shows an intersection area LCA of the trace lines TL1, TL2, and TL3. The intersection area LCA of the second trace line TL2 and the third trace line TL3 is shown as a representative example. In the intersection area LCA, one of the second trace line TL2 and the third trace line TL3 may include a bridge pattern. The bridge pattern may be disposed on a layer different from a layer on which the second trace line TL2 and the third trace line TL3 are disposed and may prevent the second trace line TL2 and the third trace line TL3 from being short-circuited.

FIG. 7 shows an equivalent circuit of the first input sensor 201 between a driving circuit DCC and a sensing circuit SCC. The equivalent circuit will be described based on a current path formed between the first electrode E1 disposed at the uppermost side of the first input sensor 201 shown in FIG. 6 and the second electrode E2 disposed at the rightmost side of the first input sensor 201 shown in FIG. 6.

The driving signal Sdr may be applied to the first electrode E1 via the first trace line TL1 and the second trace line TL2. A sensing signal Sse corresponding to the driving signal Sdr may be input to the sensing circuit SCC via the third trace line TL3. An integrated circuit mounted on a circuit board electrically connected to the first pad PD1 to the third pad PD3 may include the driving circuit DCC and the sensing circuit SCC.

The sensing circuit SCC may include a sensing channel 222, an analog-to-digital converter 224 (hereinafter, referred to as an ADC), and a processor 226. The sensing channel 222 may be provided in each of the second electrodes E2 (refer to FIG. 6). The sensing channels 222 may be connected to the same ADC 224.

In the present embodiment, the sensing channel 222 may include an amplifier AMP1 such as an operational (OP) amplifier. A first input terminal IN1 of the amplifier AMP1, e.g., an inverting input terminal of the OP amplifier, may receive the sensing signal Sse. In addition, a second input terminal IN2 of the amplifier AMP1, e.g., a non-inverting input terminal of the OP amplifier, may act as a reference electric potential terminal and may receive a reference voltage such as a ground (GND) voltage. A capacitor CC and a reset switch SW may be connected between the first input terminal IN1 and an output terminal OUT1 of the amplifier AMP1 in parallel to each other.

The ADC 224 may convert an analog signal from the sensing channel 222 to a digital signal. The processor 226 may process the converted signal (the digital signal) from the ADC 224 and may sense a touch input according to the signal process result. As an example, the processor 226 may comprehensively analyze the signal (the amplified and converted sensing signal Sse) input thereto from the second electrodes E2 (refer to FIG. 6) via the sensing channel 222 and the ADC 224 and may sense the input. The processor 226 may be implemented by a microprocessor (MPU). In this case, the sensing circuit SCC may further include a memory required to drive the processor 226. According to an embodiment, the processor 226 may be implemented by a microcontroller.

A first resistor R-T1 and a second resistor R-E1 may be connected in series between the first pad PD1 and a mutual capacitor Cse. The first resistor R-T1 may be an equivalent resistor of the first trace line TL1, and the second resistor R-E1 may be an equivalent resistor of the first electrode E1. A first parasitic capacitor C-T1 and a second parasitic capacitor C-E1 may be connected between the first pad PD1 and the mutual capacitor Cse. The first parasitic capacitor C-T1 may be defined between the first trace line TL1 and the cathode CE (refer to FIG. 5), and the second parasitic capacitor C-E1 may be defined between the first electrode E1 and the cathode CE.

A third resistor R-T2 may be formed between the second pad PD2 and the mutual capacitor Cse and may be connected to the first resistor R-T1 in parallel. A third parasitic capacitor C-T2 may be formed between the second pad PD2 and the mutual capacitor Cse and may be connected to the first parasitic capacitor C-T1 in parallel. The third resistor R-T2 may be an equivalent resistor of the second trace line TL2, and the third parasitic capacitor C-T2 may be defined between the second trace line TL2 and the cathode CE.

In addition, a fourth resistor R-E2 and a fifth resistor R-T3 may be connected in series between the third pad PD3 and the mutual capacitor Cse. The fourth resistor R-E2 may be an equivalent resistor of the second electrode E2, and the fifth resistor R-T3 may be an equivalent resistor of the third trace line TL3. A fourth parasitic capacitor C-E2 and a fifth parasitic capacitor C-T3 may be connected between the third pad PD3 and the mutual capacitor Cse. The fourth parasitic capacitor C-E2 may be defined between the second electrode E2 and the cathode CE, and the fifth parasitic capacitor C-T3 may be defined between the third trace line TL3 and the cathode CE.

The driving signal Sdr may be an alternating current signal, e.g., a sine wave signal. As the double-routing structure is applied to the first electrode E1, a combined resistance of the equivalent circuit shown in FIG. 7 may be lowered. Accordingly, bandwidth characteristics of the input sensor 200 may be improved, and a bandwidth of the alternating current signal may be widened.

Referring to FIG. 6 again, at least one of the first trace line TL1 and the second trace line TL2 may overlap the first sensing area 200-SA1. In the present embodiment, the second trace line TL2 may overlap the first sensing area 200-SA1. The first trace line TL1 connected to an end of the first electrode E1 might not overlap the first sensing area 200-SA1. Even though the first trace line TL1 is not connected to the end of the first electrode E1, the first point P1 where the first electrode E1 is connected to the first trace line TL1 may be disposed closer to the non-sensing area 200-NSA than the second point P2 where the first electrode E1 is connected to the second trace line TL2 is. The first point P1 might not overlap the sensing area 200-SA, and even though the first point P1 overlaps the sensing area 200-SA, the first point P1 may be disposed relatively close to the non-sensing area 200-NSA. However, the second point P2 might only overlap the sensing area 200-SA, and thus, there is a limitation in arranging the second point P2 closer to the non-sensing area 200-NSA. For the same reason, the second electrode E2 and the third point P3 may also be disposed closer to the non-sensing area 200-NSA than second point P2 is.

The second trace line TL2 may overlap the first electrode E1 and might not overlap the second electrode E2 in the sensing area 200-SA. Referring to the second trace line TL2 disposed at the rightmost position of the first input sensor 201, the second trace line TL2 may extend in the same direction, e.g., the second direction DR2, as the direction in which the second electrodes E2 extend in the first sensing area 200-SA1. The second trace line TL2 may extend in the second direction DR2 via the area in which the first electrodes E1 are disposed, and this will be described later.

Figure 8A:
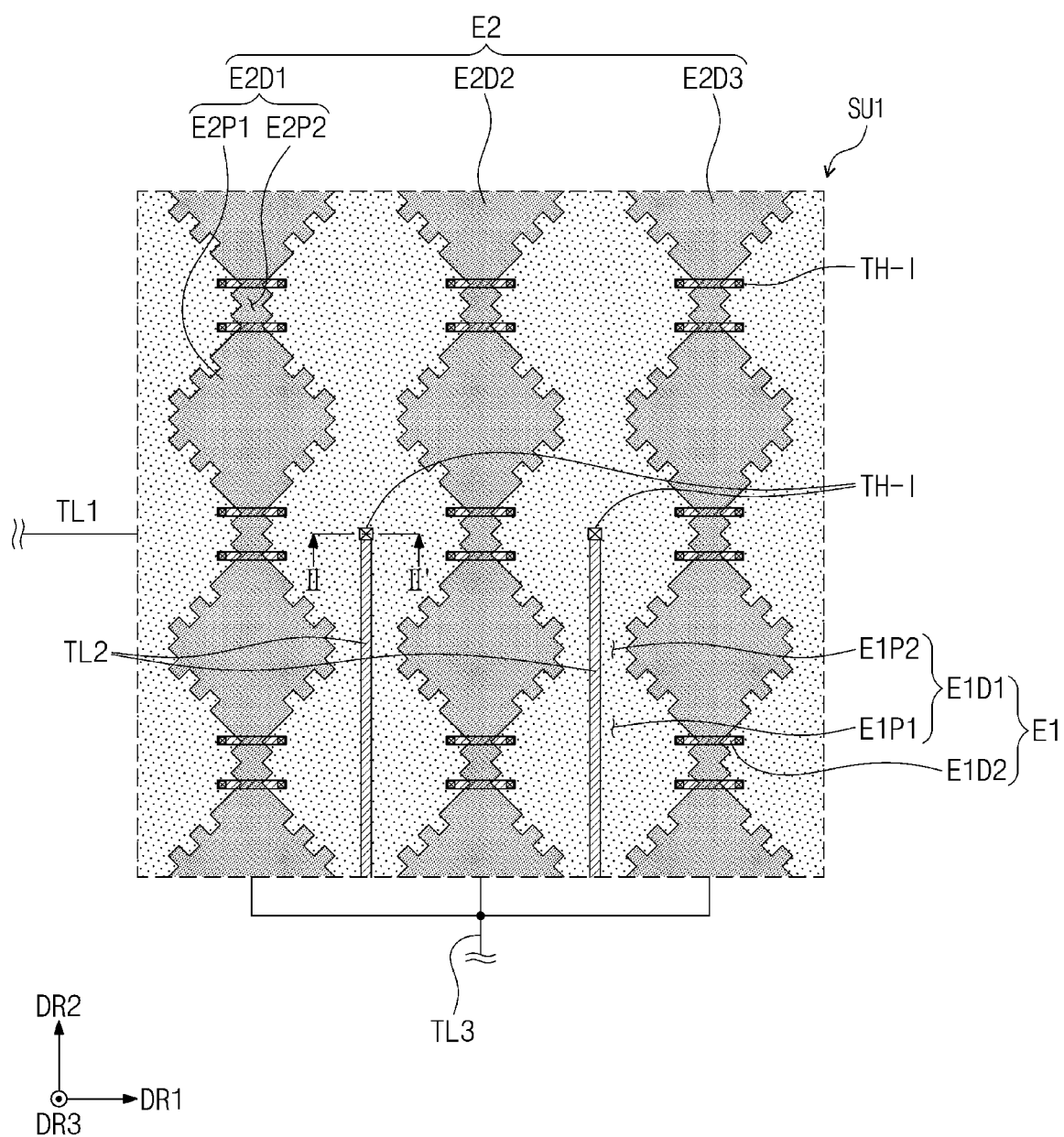
FIGS. 8A and 8B are enlarged plan views of a sensing area according to an embodiment of the present disclosure.
Figure 8B:
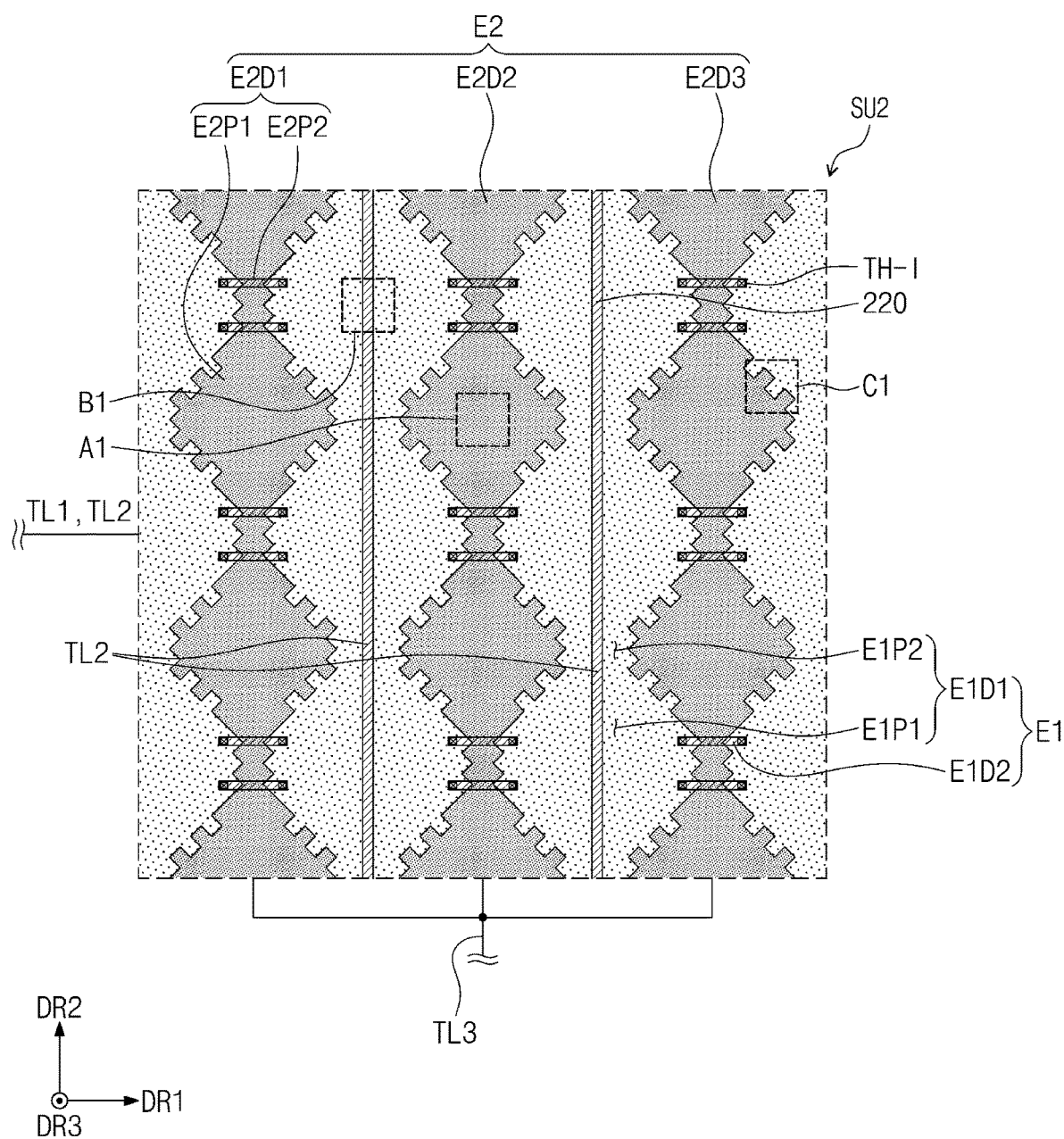
Figure 8C:
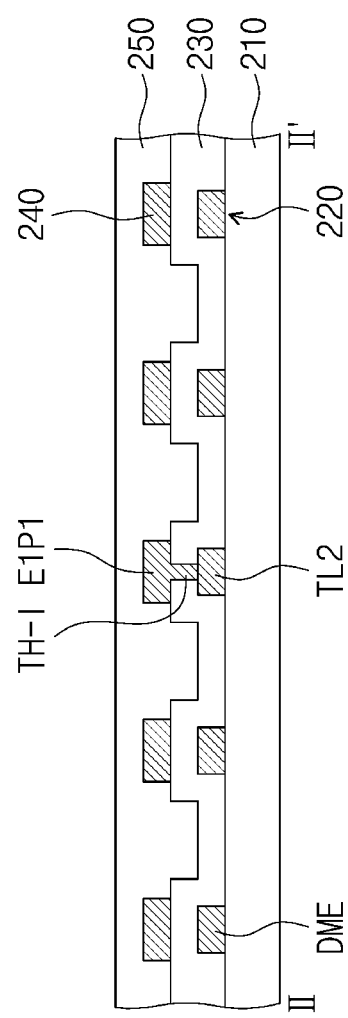
FIG. 8C is a cross-sectional view of an input sensor taken along a line II-IF of FIG. 8A.

FIGS. 8A and 8B are enlarged plan views of the sensing area 200-SA according to an embodiment of the present disclosure, and FIG. 8C is a cross-sectional view of the input sensor 200 taken along a line II-IF of FIG. 8A.

FIGS. 8A and 8B respectively show a first sensing unit SU1 where one first electrode E1 intersects one second electrode E2 and a second sensing unit SU2 where another first electrode E1 intersects the one second electrode E2 among the sensing units SU of FIG. 6. The first sensing unit SU1 and the second sensing unit SU2 may have substantially the same structure as one another except the second trace line TL2 is connected to one first electrode E1 in the first sensing unit SU1. When the second sensing unit SU2 overlaps the second trace line TL2, the other first electrode E1 disposed in the second sensing unit SU2 may be connected to a corresponding second trace line TL2 via another sensing unit SU as shown in FIG. 6.

Referring to FIGS. 8A and 8B, the second electrode E2 may include a plurality of divided electrodes E2D1, E2D2, and E2D3 extending substantially in the second direction DR2 and arranged spaced apart from each other in the first direction DR1 in the sensing area 200-SA. Three divided electrodes E2D1, E2D2, and E2D3 are shown in FIGS. 8A and 8B as a representative example. Hereinafter, the three divided electrodes E2D1, E2D2, and E2D3 may be referred to as a first divided electrode E2D1, a second divided electrode E2D2, and a third divided electrode E2D3, respectively, to differentiate and explain the three divided electrodes E2D1, E2D2, and E2D3.

Each of the divided electrodes E2D1, E2D2, and E2D3 may include two types of portions with different shapes. A portion with a relatively large size may be referred to as a sensing portion E2P1, and a portion with a relatively small size may be referred to as an intermediate portion E2P2. The sensing portions E2P1 and the intermediate portions E2P2 may be alternately arranged with each other in the second direction DR2. The sensing portions E2P1 may be provided integrally with the intermediate portions E2P2. The divided electrodes E2D1, E2D2, and E2D3 may be formed from the second conductive layer 240 described with reference to FIG. 5.

The first electrode E1 may include sensing patterns E1D1 and bridge patterns E1D2 disposed on a layer different from a layer on which the sensing patterns E1D1 are disposed. The sensing patterns E1D1 may be spaced apart from each other in the first direction DR1 and may be disposed between the divided electrodes E2D1, E2D2, and E2D3. Each of the sensing patterns E1D1 may include two types of portions with different shapes. A portion with a relatively large size may be referred to as a sensing portion E1P1, and a portion with a relatively small size may be referred to as an intermediate portion E1P2. The sensing patterns E1D1 including three sensing portions E1P1 and two intermediate portions E1P2 are shown as an example. The sensing portions E1P1 and the intermediate portions E1P2 may be alternately arranged with each other in the second direction DR2. The sensing portions E1P1 may be provided integrally with the intermediate portions E1P2. The sensing portion E1P1 of the sensing patterns E1D1 may be disposed between the intermediate portions E2P2 of the divided electrodes E2D1, E2D2, and E2D3.

FIG. 8A shows only a portion of the first electrode E1 corresponding to the first sensing unit SU1, however, referring to FIGS. 6 and 8A, the first electrode E1 may include the sensing patterns E1D1 corresponding to the sensing units SU arranged in the first direction DR1.

Referring to FIGS. 6, 8A, and 8B, the sensing patterns E1D1 of the first sensing unit SU1 and the sensing patterns E1D1 of the second sensing unit SU2 may be spaced apart from each other in the second direction DR2. Six bridge patterns E1D2 that connect two sensing patterns E1D1 disposed adjacent to each other in the first direction DR1 are shown as a representative example. The shape and number of the bridge patterns E1D2 should not necessarily be particularly limited thereto.

Referring to FIGS. 8A and 8B, the second trace lines TL2 may be disposed between the first divided electrode E2D1 and the second divided electrode E2D2 and between the second divided electrode E2D2 and the third divided electrode E2D3. The second trace line TL2 may overlap at least one of the sensing patterns E1D1 and might not overlap the second electrode E2, in the plan view. Accordingly, a signal interference between the second electrode E2 and the second trace line TL2 or an influence of the parasitic capacitor may be minimized. FIGS. 8A and 8B show the structure in which one sensing unit SU1 or SU2 overlaps two second trace lines TL2, however, the structure should not necessarily be limited thereto or thereby. One second trace line TL2 overlapping one sensing pattern among the sensing patterns E1D1 may correspond to the sensing unit SU1 or SU2.

Referring to FIGS. 8A to 8C, the second trace line TL2 may be connected to a corresponding first electrode E1 among the first electrodes E1. The second trace line TL2 may be connected to the corresponding first electrode E1 via a contact hole TH-I defined through the second insulating layer 230. The third insulating layer 250 may cover the first electrode E1. The sensing pattern E1D1 and the bridge pattern E1D2 of FIGS. 8A and 8B may also be connected to each other via the contact hole TH-I. Referring to FIG. 8C, a dummy electrode DME and the second trace line TL2 may be disposed on the same layer, and the dummy electrode DME will be described later with reference to FIG. 10B.

Figure 9A:
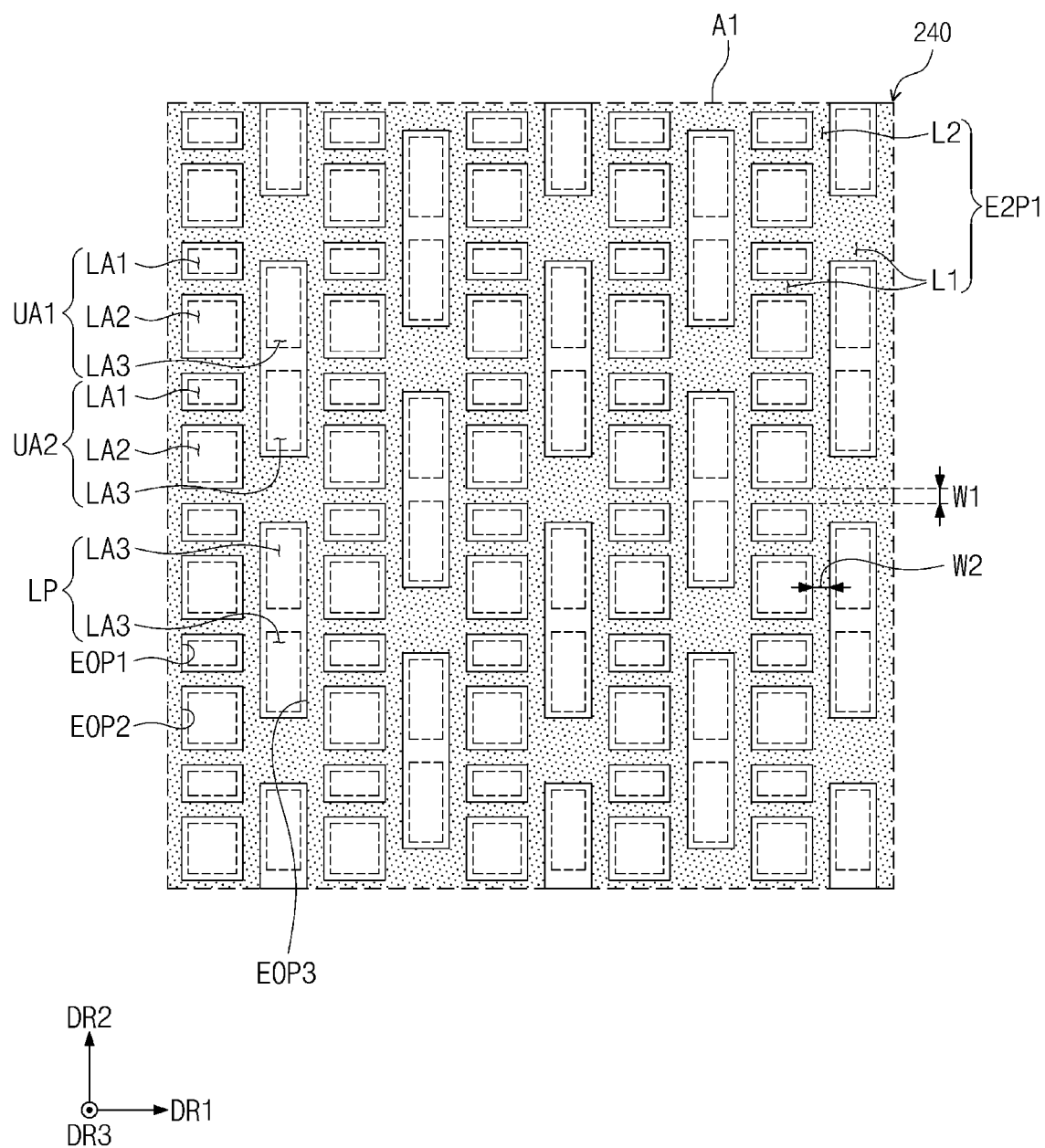
FIG. 9A is an enlarged plan view of a second conductive layer corresponding to a first area of FIG. 8B.
Figure 9B:
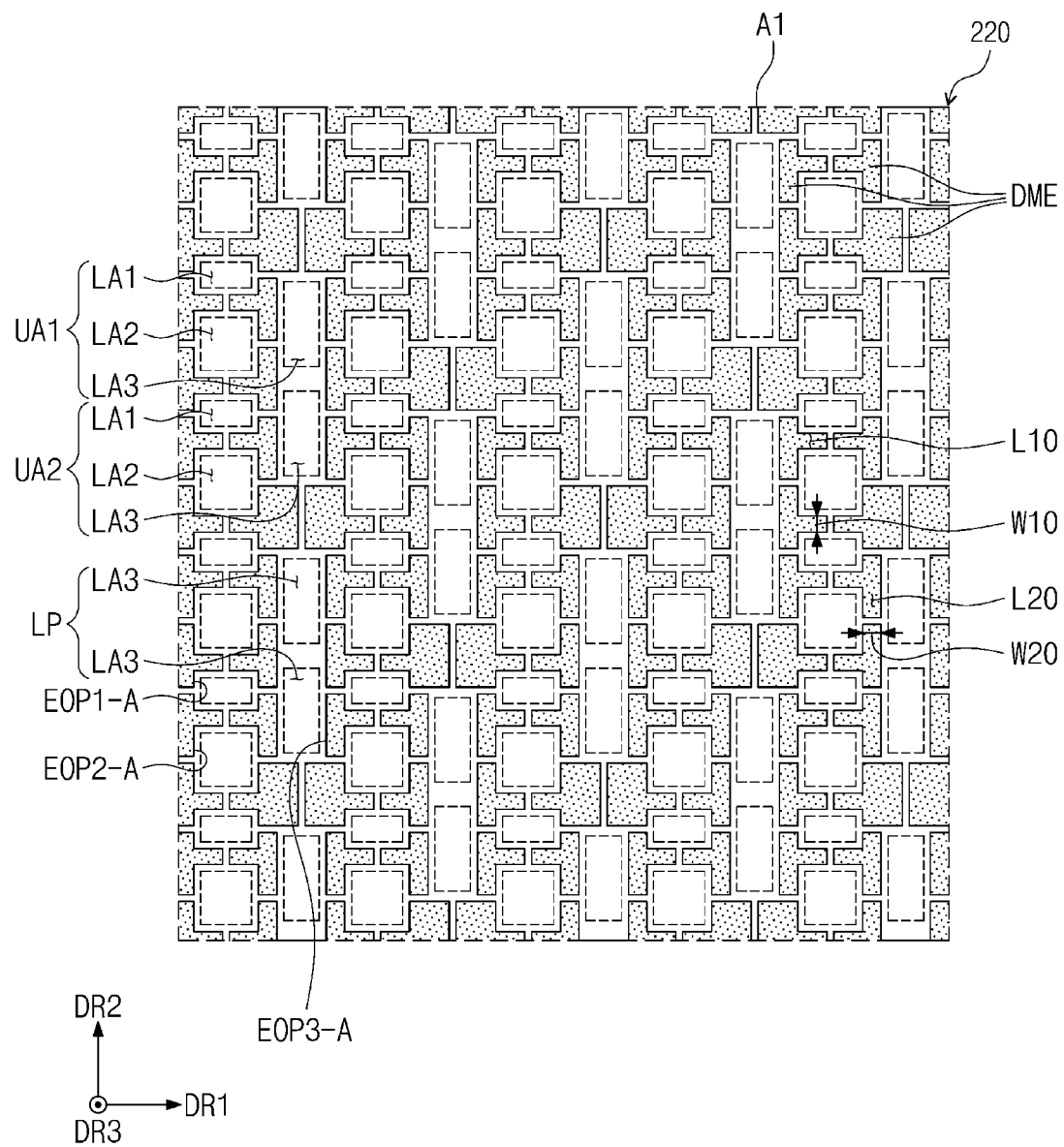
FIG. 9B is an enlarged plan view of a first conductive layer corresponding to the first area of FIG. 8B.
Figure 10A:
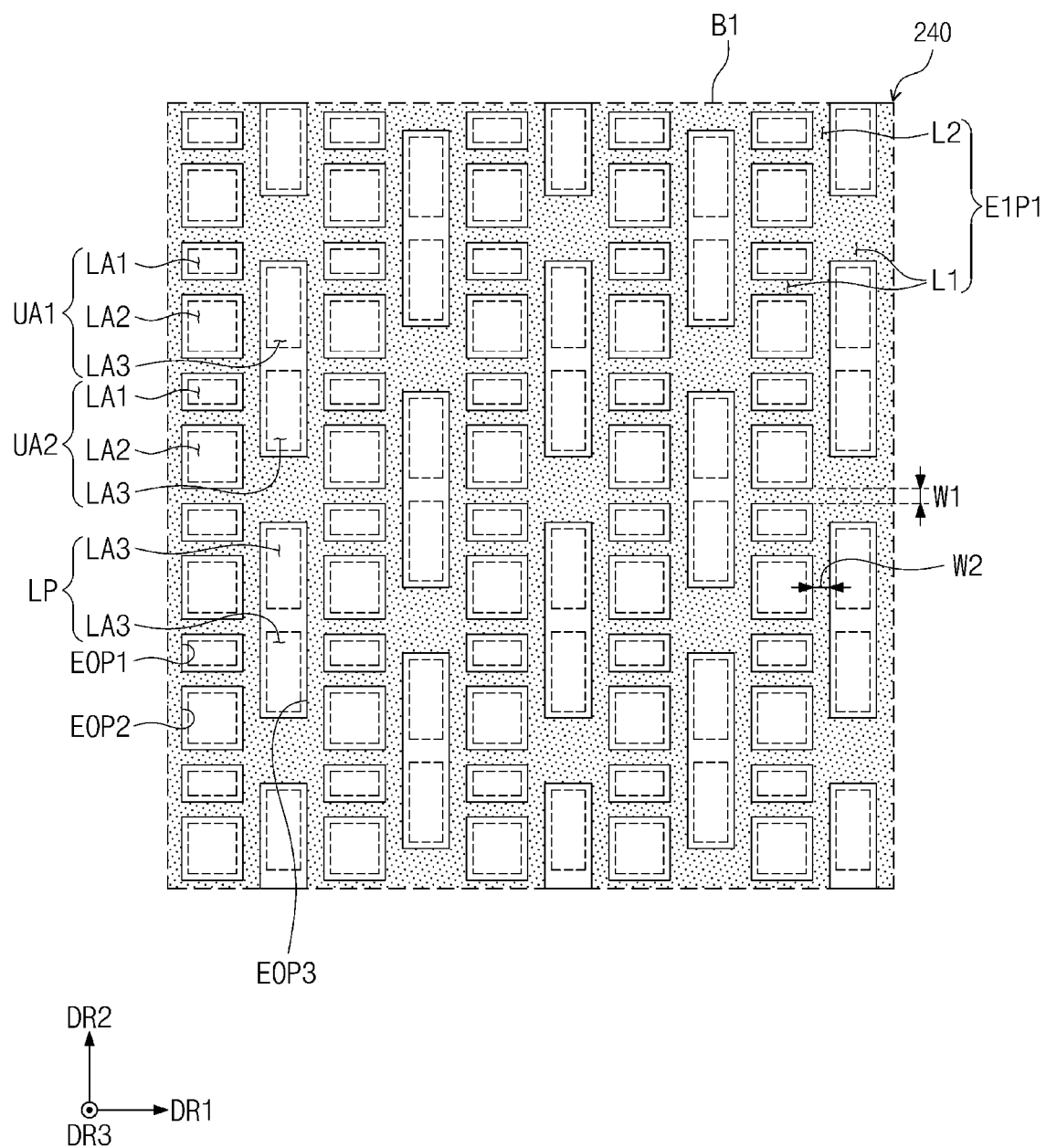
FIG. 10A is an enlarged plan view of a second conductive layer corresponding to a second area of FIG. 8B.
Figure 10B:
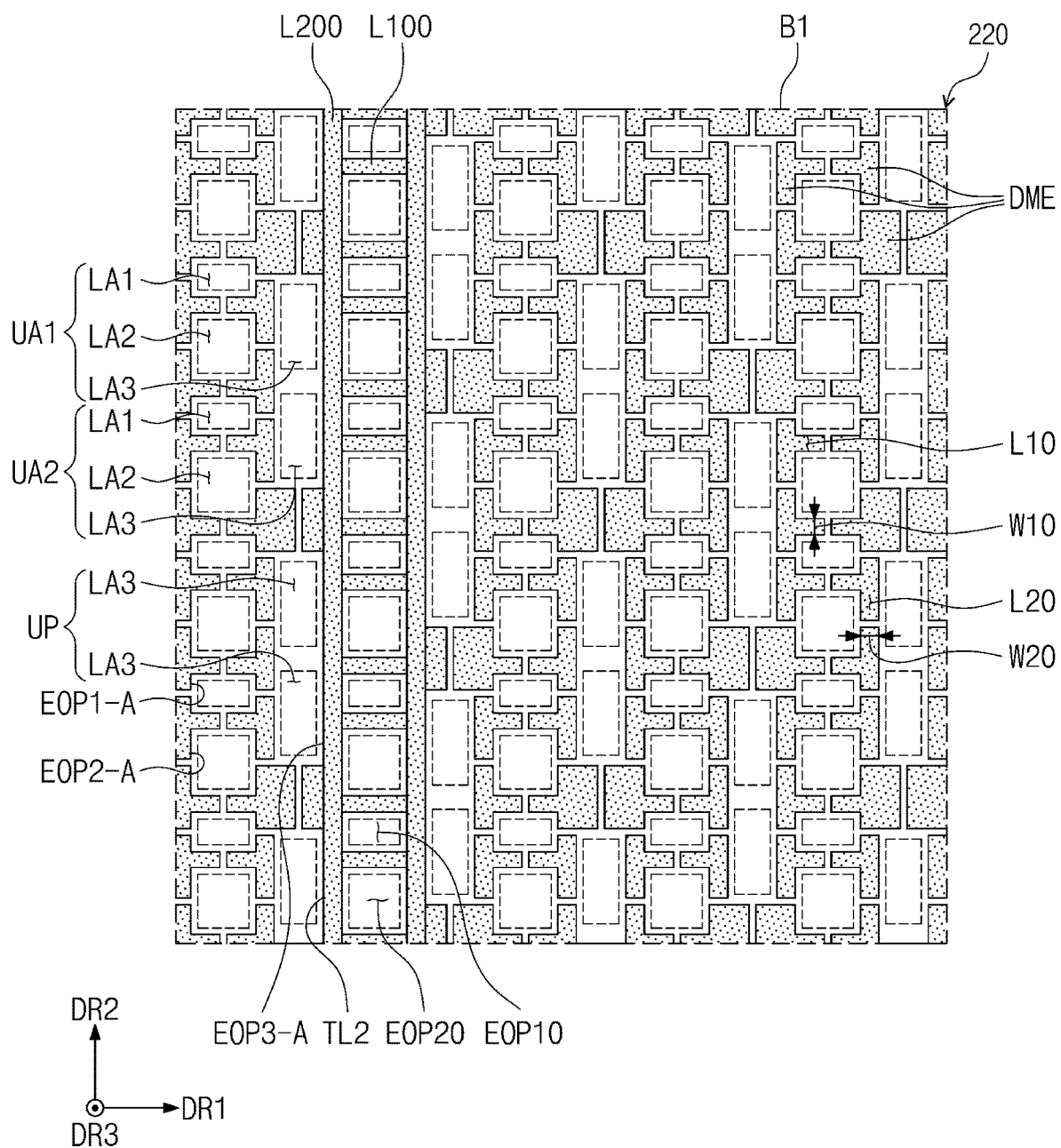
FIG. 10B is an enlarged plan view of a first conductive layer corresponding to the second area of FIG. 8B.
Figure 11A:
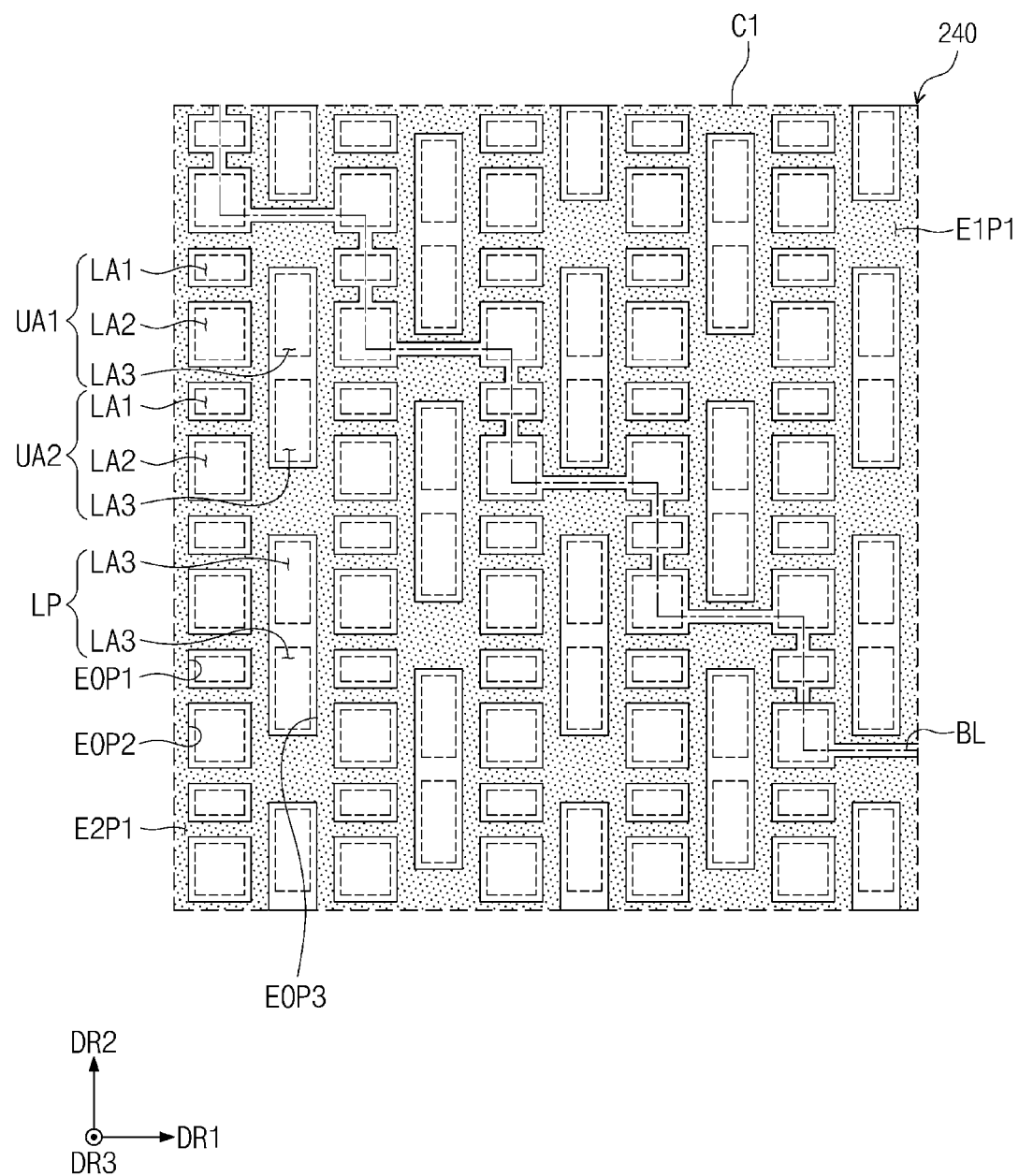
FIG. 11A is an enlarged plan view of a second conductive layer corresponding to a third area of FIG. 8B.
Figure 11B:
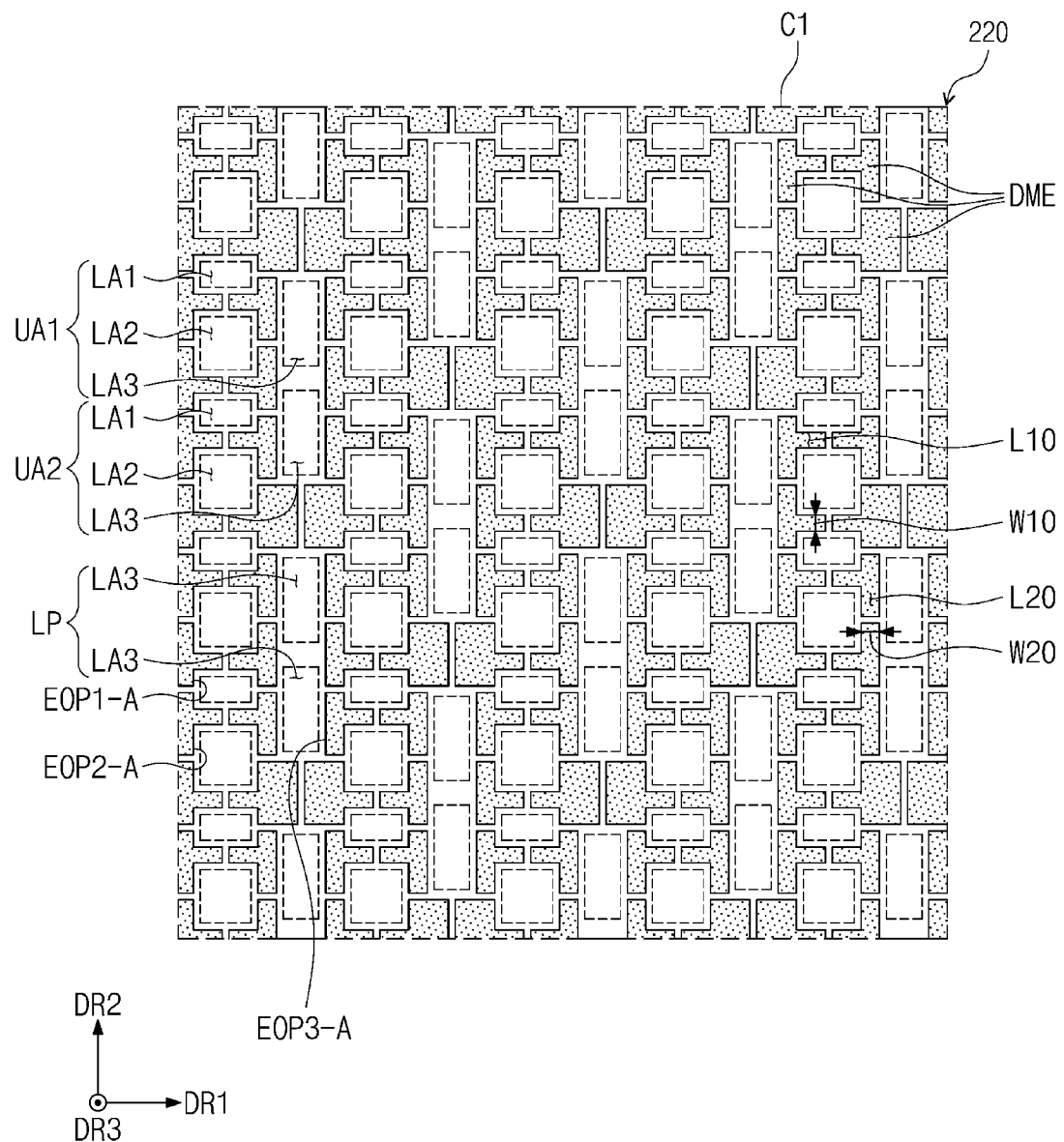
FIG. 11B is an enlarged plan view of a first conductive layer corresponding to the third area of FIG. 8B.

FIG. 9A is an enlarged plan view of the second conductive layer 240 corresponding to a first area A1 of FIG. 8B. FIG. 9B is an enlarged plan view of the first conductive layer 220 corresponding to the first area A1 of FIG. 8B. FIG. 10A is an enlarged plan view of the second conductive layer 240 corresponding to a second area B1 of FIG. 8B. FIG. 10B is an enlarged plan view of the first conductive layer 220 corresponding to the second area B1 of FIG. 8B. FIG. 11A is an enlarged plan view of the second conductive layer 240 corresponding to a third area C1 of FIG. 8B. FIG. 11B is an enlarged plan view of the first conductive layer 220 corresponding to the third area C1 of FIG. 8B.

In FIGS. 9A to 11B, the second conductive layer 240 corresponds to the second conductive layer 240 of FIG. 5, and the first conductive layer 220 corresponds to the first conductive layer 220 of FIG. 5. FIG. 9A is an enlarged view of the sensing portion E2P1 formed from the second conductive layer 240. The sensing portion E2P1 is shown to represent the second electrode E2. In FIGS. 9A to 11B, the display area 100-DA shown in FIG. 4A is shown.

Referring to FIGS. 8B and 9A, a plurality of openings EOP1, EOP2, and EOP3 may be defined through the sensing portion E2P1 of the second electrode E2. The openings EOP1, EOP2, and EOP3 may include a first opening EOP1 corresponding to the first light emitting area LA1, a second opening EOP2 corresponding to the second light emitting area LA2, and a third opening EOP3 corresponding to the light emitting area pair LP. The first light emitting area LA1 may be disposed inside the first opening EOP1, the second light emitting area LA2 may be disposed inside the second opening EOP2, and the light emitting area pair LP may be disposed inside the third opening EOP3. The third light emitting area LA3 of the first unit light emitting area UA1 and the third light emitting area LA3 of the second unit light emitting area UA2 shown in FIG. 4A may be commonly disposed inside the third opening EOP3.

The sensing portion E2P1 may include a plurality of line components L1 and L2 that defines the openings EOP1, EOP2, and EOP3. The line components L1 and L2 may include first line components L1 extending in the first direction DR1 and second line components L2 extending in the second direction DR2. Each of the first line components L1 may extend from one second line component L2 to another second line component L2 adjacent to the one second line component L2. The first line components L1 may be disposed between two openings EOP1, EOP2, and EOP3 adjacent to each other in the second direction DR2 among the openings EOP1, EOP2, and EOP3, and the first line components L1 may include plural groups of the line components, which are distinguished from each other depending on their widths in the second direction DR2.

Referring to FIG. 9B, a plurality of dummy electrodes DME may be disposed in an area overlapping the sensing portion E2P1 shown in FIG. 9A. The dummy electrodes DME may be arranged in an arrangement obtained by cutting (or dividing) the sensing portion E2P1 shown in FIG. 9A in a predetermined rule. Since the dummy electrodes DME completely overlap the sensing portion E2P1, a step difference due to the first conductive layer 220 (refer to FIG. 5) may be prevented from occurring.

Four dummy electrodes DME may be arranged around a first area EOP1-A. The first area EOP1-A may correspond to the first opening EOP1. Two cutting areas (or divided areas) facing each other in the second direction DR2 may be arranged around the first area EOP1-A, and two cutting areas facing each other in the first direction DR1 may be arranged around the first area EOP1-A. Four dummy electrodes DME may be arranged around the second area EOP2-A corresponding to the second opening EOP2. Two cutting areas facing each other in the second direction DR2 may be arranged around the second area EOP2-A, and two cutting areas facing each other in the first direction DR1 may be arranged around the second area EOP2-A. Two pairs of cutting areas facing each other in the second direction DR2 may be arranged around the third area EOP3-A, and two cutting areas facing each other in the first direction DR1 may be arranged around the third area EOP3-A.

Referring to FIGS. 9A and 9B, the sensing portion E2P1 may have a width that is greater than that of the dummy electrode DME. The first line component L1 of the sensing portion E2P1 may have a width W1 that is greater than a width W10 of a cut first line component L10 of the dummy electrode DME, and the second line component L2 of the sensing portion E2P1 may have a width W2 that is greater than a width W20 of a cut second line component L20 of the dummy electrode DME. Accordingly, the sensing portion E2P1 may cover the dummy electrode DME. Referring to FIGS. 9A and 9B, the widths of the first line component L1 of the sensing portion E2P1 and the first line component L10 of the dummy electrode DME, which overlap each other, may be compared with each other. Referring to FIG. 8C, the width of the sensing portion E1P1 of the first electrode E1 and the width of the dummy electrode DME may be compared with each other.

Referring to FIGS. 8B and 10A, the sensing portion E1P1 of the first electrode E1 may be substantially the same as the sensing portion E2P1 of the second electrode E2 of FIGS. 8B and 9A. Referring to FIG. 10B, the second trace line TL2 and the dummy electrodes DME may be disposed in the area overlapping the sensing portion E1P1 of FIG. 10A. The second trace line TL2 may include second line components L200 extending in the second direction DR2 and first line components L100 disposed between the second line components L20. A first opening EOP10 corresponding to the first opening EOP1 of FIG. 10A and a second opening EOP20 corresponding to the second opening EOP2 of FIG. 10A may be defined through the second trace line TL2. The dummy electrodes DME may be disposed in an area except the area in which the second trace line TL2 is disposed. When compared with FIG. 9B, some of the dummy electrodes DME may be connected to each other to define the second trace line TL2.

Referring to FIGS. 8B and 11A, a boundary line BL between the sensing portion E1P1 of the first electrode E1 and the sensing portion E2P1 of the second electrode E2 is shown. As the conductive pattern of the second conductive layer 240 shown in FIG. 9A is cut in a predetermined rule, a boundary area between the sensing portion E1P1 of the first electrode E1 and the sensing portion E2P1 of the second electrode E2 may be defined.

Referring to FIG. 11B, the dummy electrodes DME may be arranged in a predetermined rule regardless of the sensing portion E1P1 of the first electrode E1 and the sensing portion E2P1 of the second electrode E2. The dummy electrodes DME may be arranged according to the same rule as that described with reference to FIG. 9B.

FIGS. 12 to 17 are plan views of input sensors 200 according to embodiments of the present disclosure. In FIGS. 12 to 17, the same reference numerals denote the same elements in FIGS. 5 to 11B, and thus, to the extent that an element is not described in detail herein, that element may be assumed to be at least similar to a corresponding element described elsewhere within the present disclosure.

Figure 12:
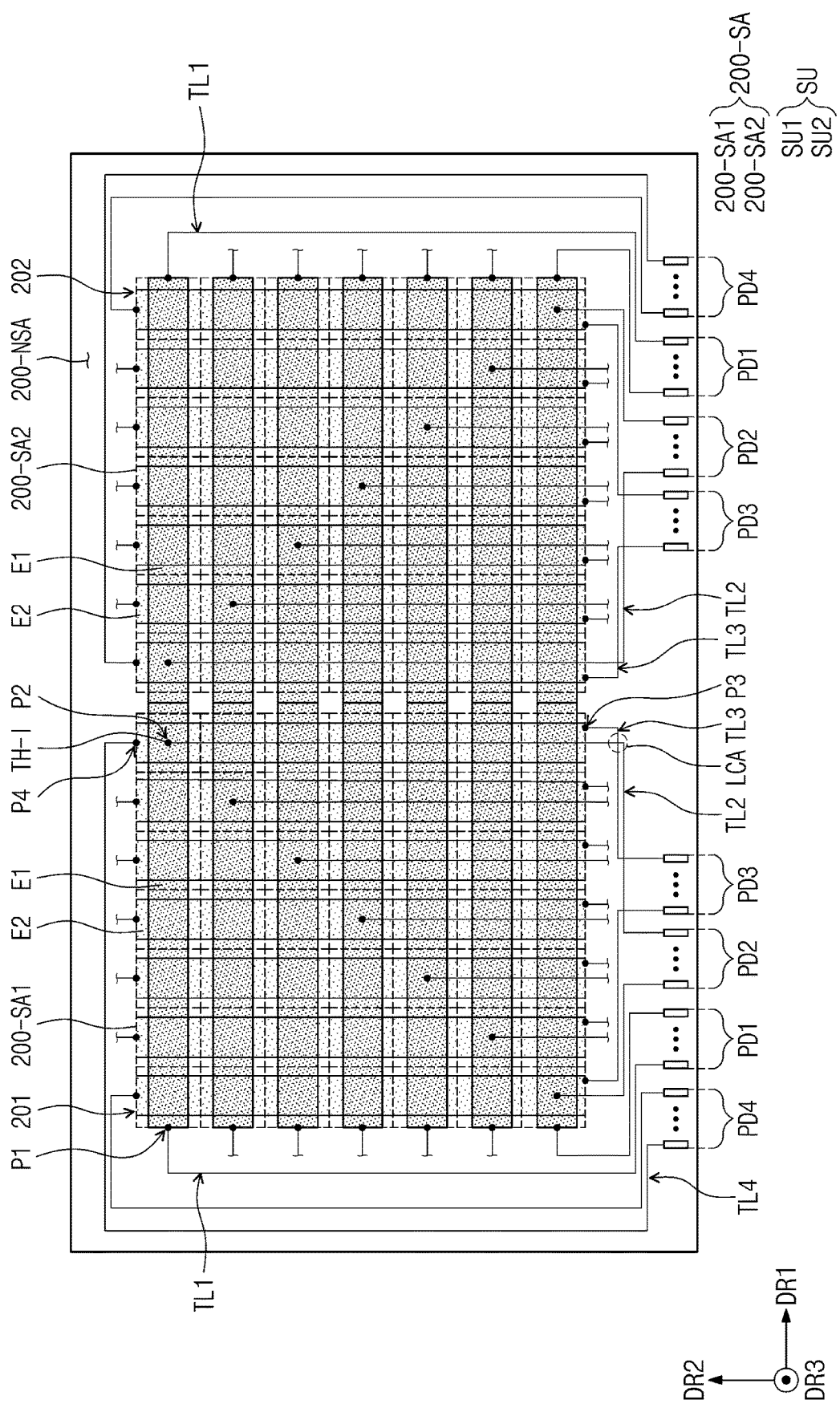
FIGS. 12 to 17 are plan views of input sensors according to embodiments of the present disclosure.

Referring to FIG. 12, second electrodes E2 may also have a double-routing structure. A fourth trace line TL4 may be connected to the second electrode E2 at a fourth point P4. The fourth trace line TL4 may overlap a non-sensing area 200-NSA and may be connected to a fourth pad PD4. The fourth pad PD4 may be disposed adjacent to a first pad PD1. The fourth point P4 may also be disposed closer to the non-sensing area 200-NSA than a second point P2 is. The fourth point P4 may be located at a position opposite to a third point P3 in the second direction DR2.

Figure 13:
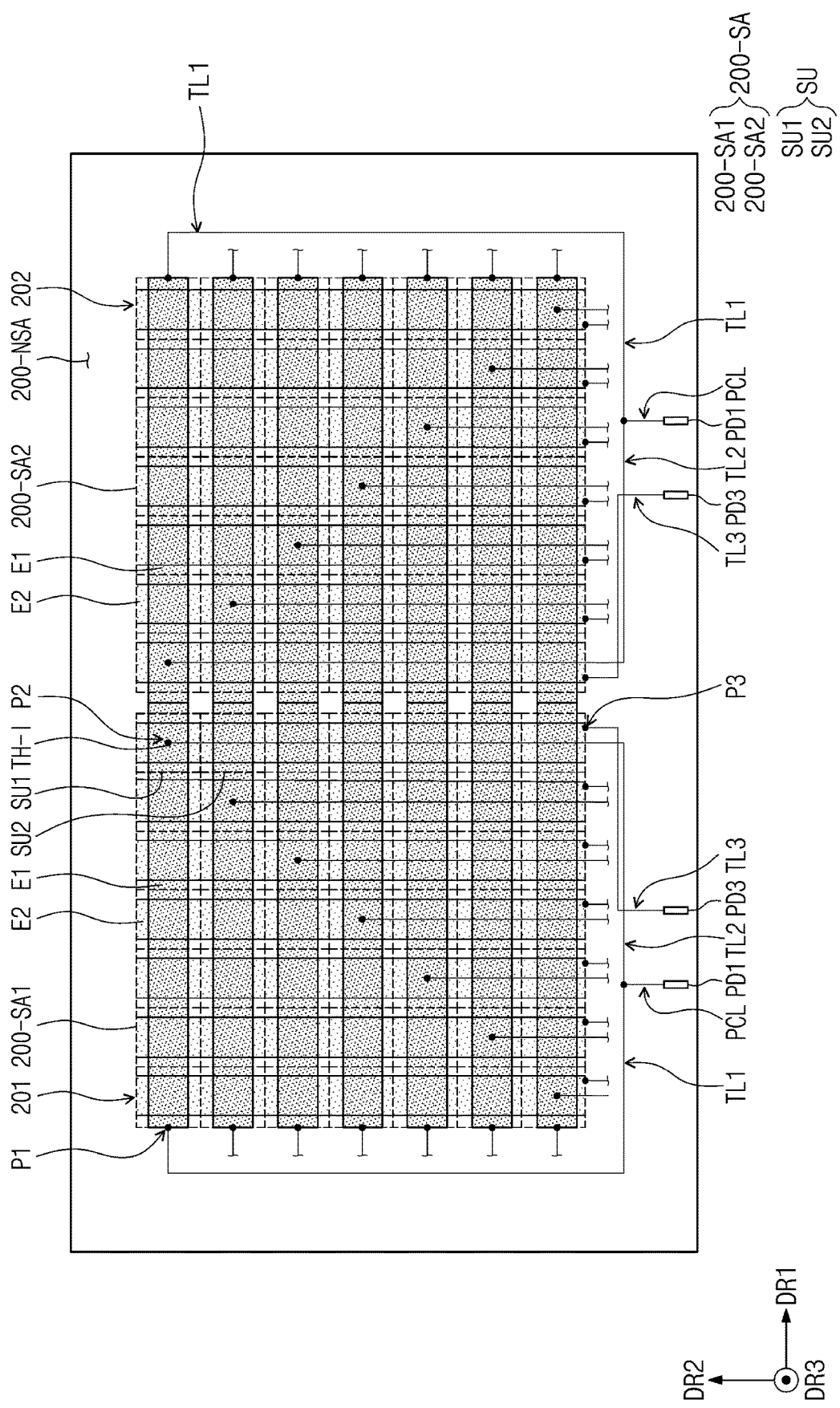

Referring to FIG. 13, a first trace line TL1 and a second trace line TL2 may be branched from a pad connection line PCL at one point of a non-sensing area 200-NSA. Accordingly, the first trace line TL1 and the second trace line TL2 may be electrically connected to a first pad PD1 via the pad connection line PCL. The second pad PD2 (refer to FIG. 6) of the input sensor 200 of FIG. 6 may be omitted from the input sensor of FIG. 13.

Referring to FIGS. 14 to 17, the input sensor 200 may further include at least one input sensor disposed between a first input sensor 201 and a second input sensor 202. FIGS. 14 to 17 show the input sensor 200 further including a third input sensor 203 and a fourth input sensor 204 as a representative example. The third input sensor 203 and the fourth input sensor 204 may be respectively disposed in a third sensing area 200-SA3 and a fourth sensing area 200-SA4 of a sensing area 200-SA. The third input sensor 203 and the fourth input sensor 204 may have substantially the same structure. Hereinafter, descriptions of the input sensors 203 and 204 will be focused on the third input sensor 203.

Referring to the first input sensor 201 to the fourth input sensor 204 of FIGS. 14 to 17, fewer sensing electrodes are illustrated as compared with FIGS. 6 and 12, and fewer trace lines are illustrated as corresponding to the sensing electrodes. First electrodes E1 and E1-1 corresponding to each other and second electrodes E2 and E2-1 corresponding to each other of the first input sensor 201 to the fourth input sensor 204 are shown.

Figure 14:
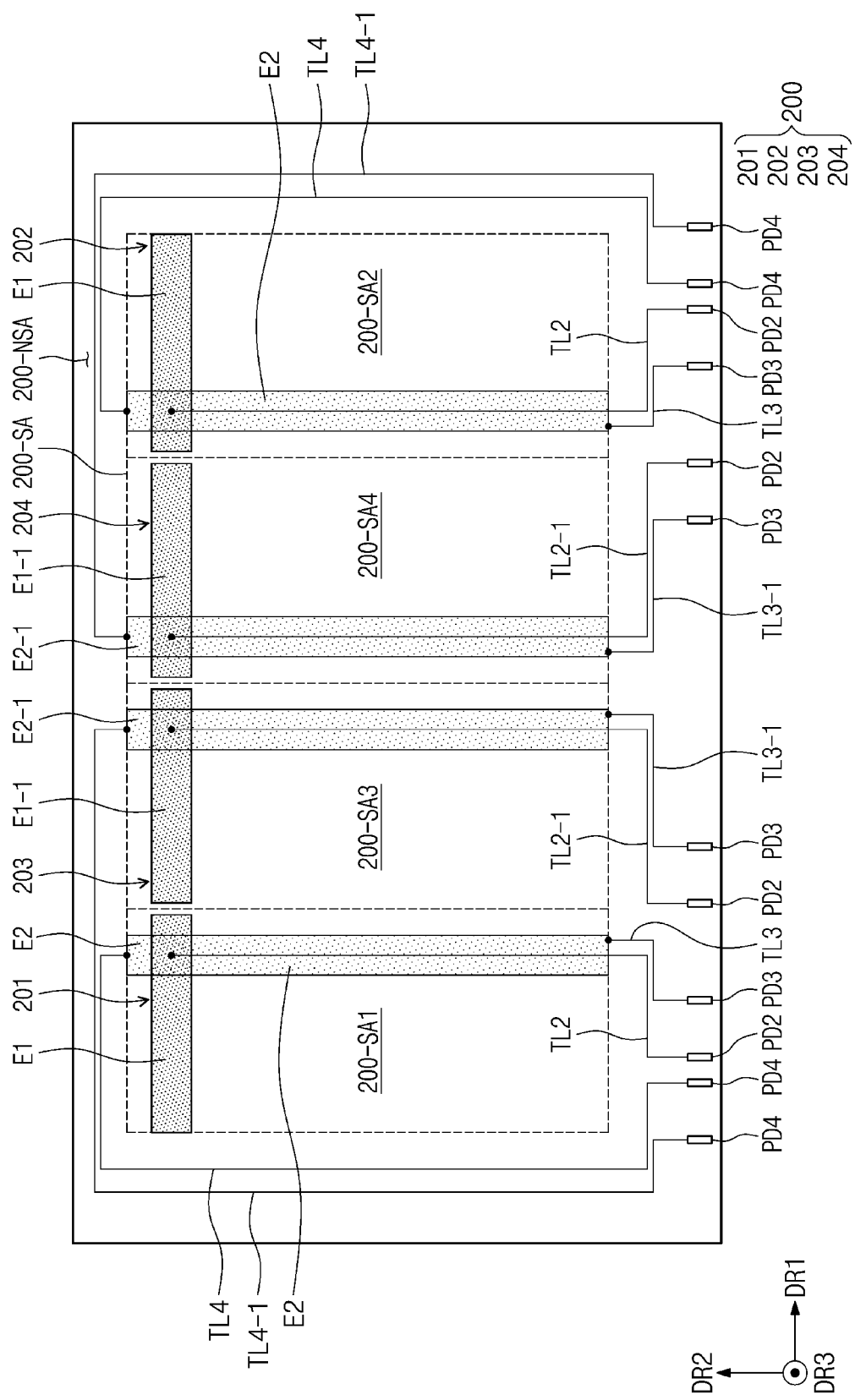

Referring to FIG. 14, the third input sensor 203 may include the first electrode E1-1 (hereinafter, referred to as a first-first electrode) corresponding to the first electrode E1 of the first input sensor 201 and the second electrode E2-1 (hereinafter, referred to as a second-first electrode) corresponding to the second electrode E2 of the first input sensor 201. The third input sensor 203 may include a second trace line TL2-1 (hereinafter, referred to as a second-first trace line) corresponding to a second trace line TL2 of the first input sensor 201, a third trace line TL3-1 (hereinafter, referred to as a third-first trace line) corresponding to a third trace line TL3 of the first input sensor 201, and a fourth trace line TL4-1 (hereinafter, referred to as a fourth-first trace line) corresponding to a fourth trace line TL4.

Different reference numerals are assigned to distinguish and explain the electrodes corresponding to each other and the trace lines corresponding to each other. The first electrode E1 and the second electrode E2 of the first input sensor 201 may correspond to the first-first electrode E1-1 and the second-first electrode E2-1 of the third input sensor 203 and may be distinguished from the first-first electrode E1-1 and the second-first electrode E2-1 of the third input sensor 203. In addition, the first-first electrode E1-1 and the second-first electrode E2-1 of the second input sensor 202 or the first-first electrode E1-1 and the second-first electrode E2-1 of the fourth input sensor 204 may be used in the present disclosure to explain and distinguish them from the first electrode E1 and the second electrode E2 of the first input sensor 201.

The first electrode E1 of the first input sensor 201 and the first-first electrode E1-1 of the third input sensor 203 may have the single-routing structure. The second electrode E2 of the first input sensor 201 and the second-first electrode E2-1 of the third input sensor 203 may have the double-routing structure. When compared with FIG. 12, the first trace line TL1 (refer to FIG. 12) and the first pad PD1 (refer to FIG. 12) are omitted from the input sensor in FIG. 14. The second-first trace line TL2-1 may overlap the first-first electrode E1-1 and might not overlap the second-first electrode E2-1 in the third sensing area 200-SA3 as the second trace line TL2 described with reference to FIGS. 6 and FIGS. 8A to 8C.

Figure 15:
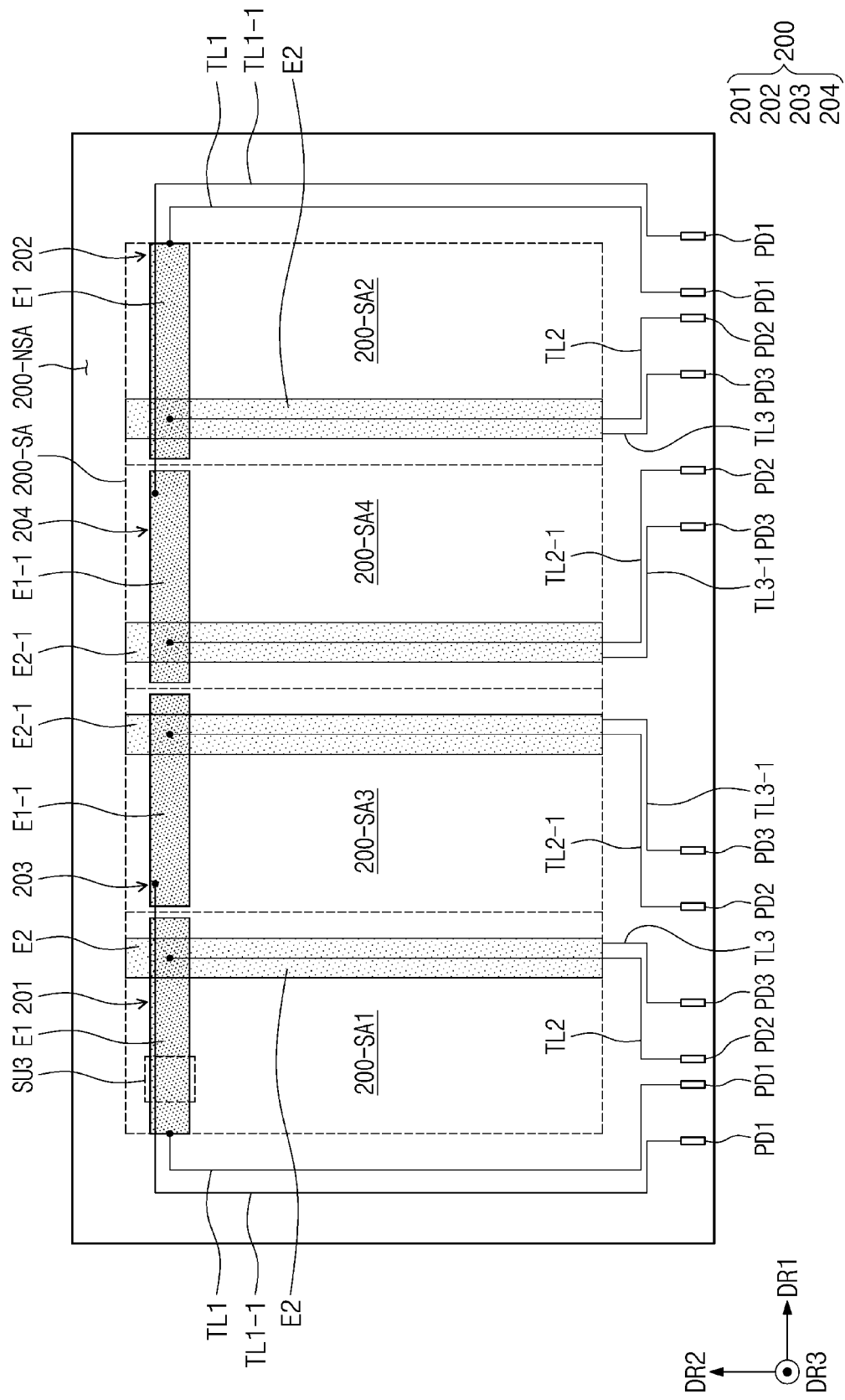

Referring to FIG. 15, the first electrode E1 of the first input sensor 201 and the first-first electrode E1-1 of the third input sensor 203 may have the double-routing structure. The second electrode E2 of the first input sensor 201 and the second-first electrode E2-1 of the third input sensor 203 may have the single-routing structure. When compared with FIG. 12, the fourth trace line TL4 (refer to FIG. 12) and the fourth pad PD4 (refer to FIG. 12) are omitted from the input sensor in FIG. 15.

A second-first trace line TL2-1 may overlap the first-first electrode E1-1 and might not overlap the second-first electrode E2-1 in the third sensing area 200-SA3 as the second trace line TL2 described with reference to FIGS. 6 and 8A to 8C. A first-first trace line TL1-1 may overlap the first sensing area 200-SA1 and the third sensing area 200-SA3. The first-first trace line TL1-1 may extend substantially in the same direction as the first electrode E1 and the first-first electrode E1-1 in the first sensing area 200-SA1 and the third sensing area 200-SA3.

Figure 16:
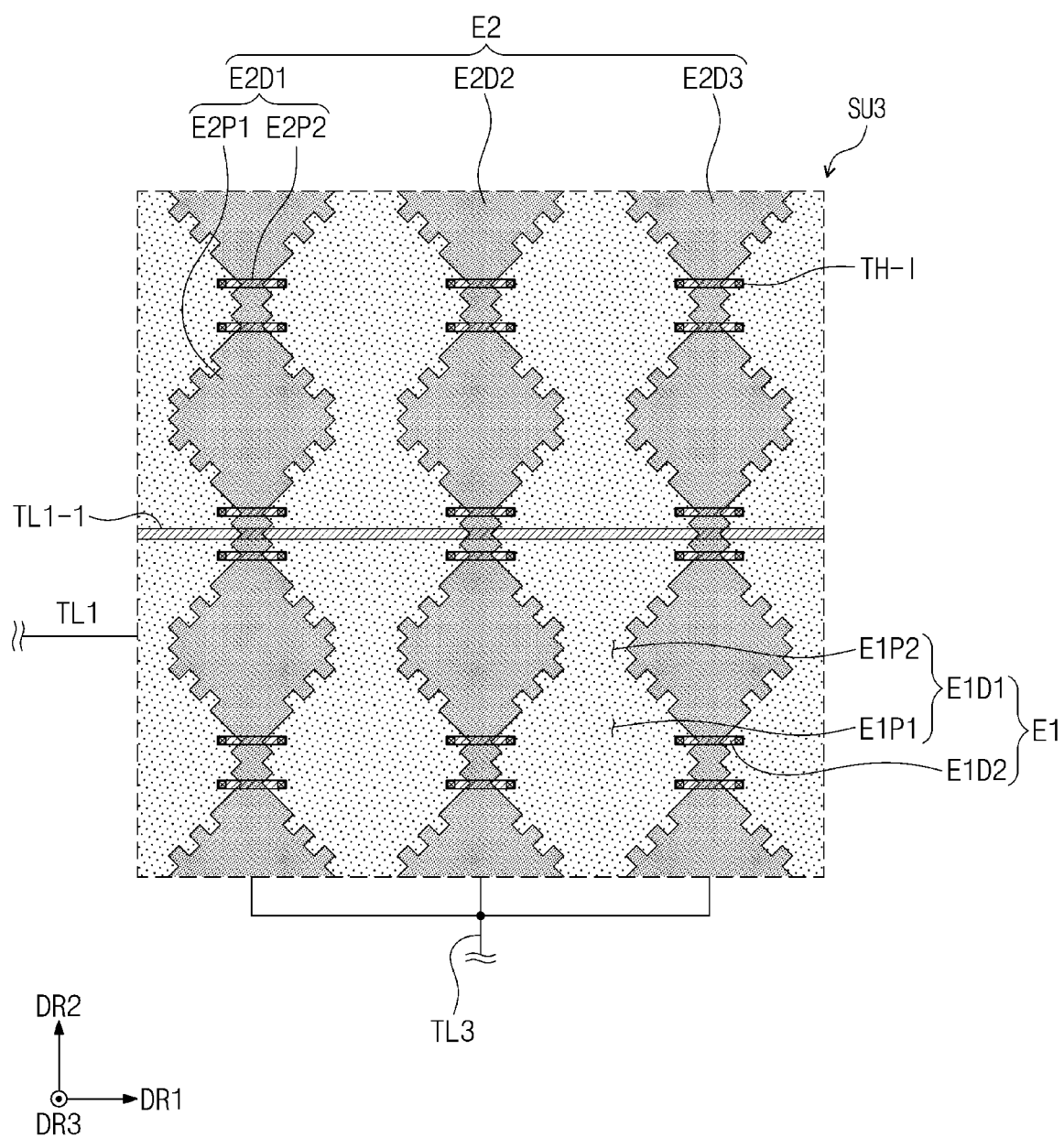

FIG. 16 is an enlarged plan view of one sensing unit SU3 (hereinafter, referred to as a third sensing unit) of FIG. 15. The third sensing unit SU3 may be substantially the same as the sensing units SU of FIG. 6 and may be substantially the same as the first sensing unit SU1 and the second sensing unit SU2 described with reference to FIGS. 8A and 8B.

Referring to FIG. 16, the first-first trace line TL1-1 may overlap the first electrode E1 and the second electrode E2. An overlap area between the first-first trace line TL1-1 and the first electrode E1 may be greater than an overlap area between the first-first trace line TL1-1 and the second electrode E2 in the third sensing unit SU3. The first-first trace line TL1-1 may overlap intermediate portions E2P2 of divided electrodes E2D1, E2D2, and E2D3 and sensing portion E1P1 of sensing patterns E1D1. An influence of the first-first trace line TL1-1 on the second electrode E2 may be reduced by reducing the overlap area of the first-first trace line TL1-1 and the second electrode E2.

Figure 17:
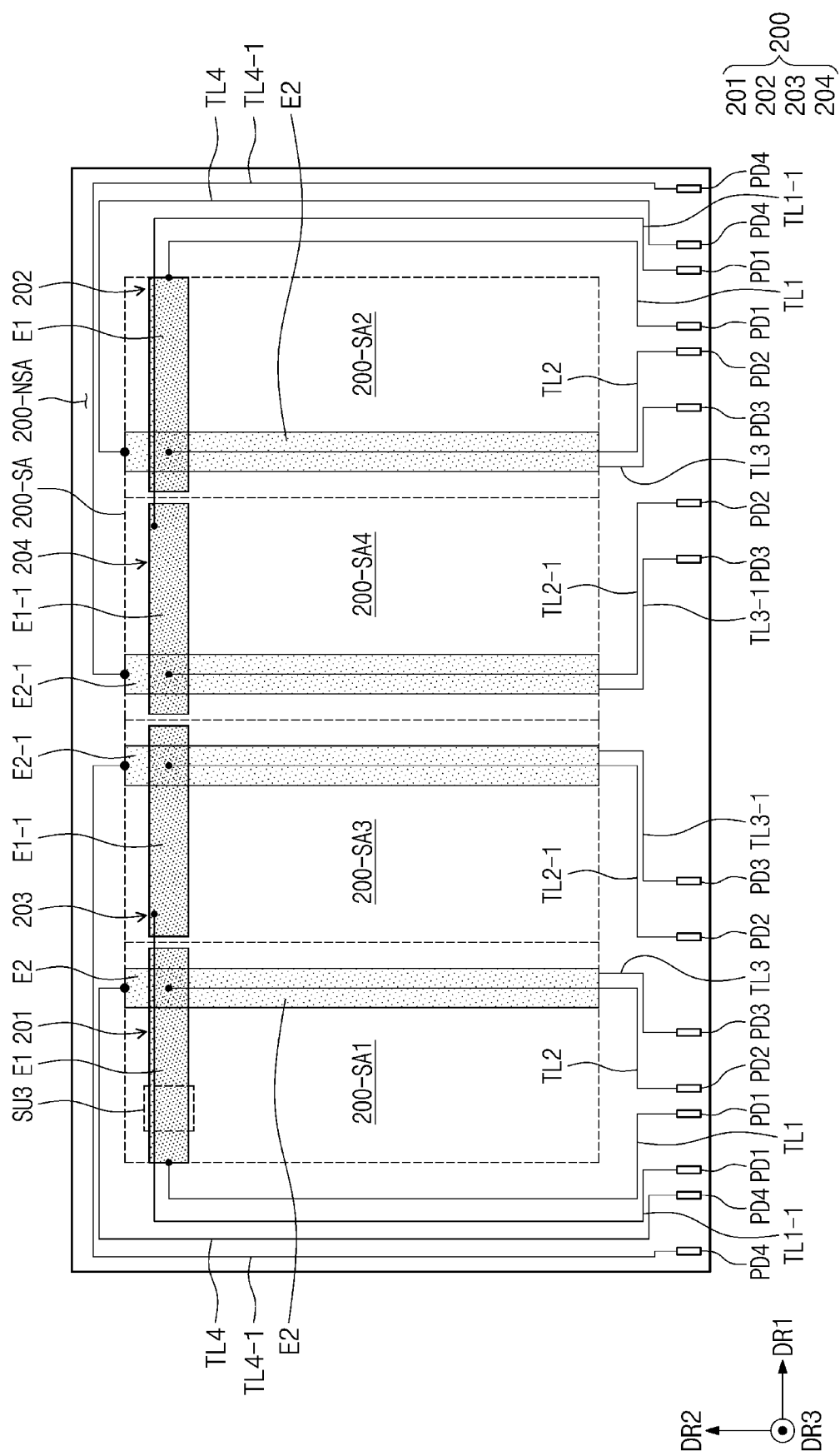

Referring to FIG. 17, the first electrode E1 of the first input sensor 201 and the first-first electrode E1-1 of the third input sensor 203 may have the double-routing structure. The second electrode E2 of the first input sensor 201 and the second-first electrode E2-1 of the third input sensor 203 may have the double-routing structure.

Although the embodiments of the present disclosure have been described, it is understood that the present disclosure should not necessarily be limited to these embodiments but various changes and modifications can be made by one ordinary skilled in the art within the spirit and scope of the present disclosure.

What is claimed is:
1. A display device, comprising:
a display panel comprising a display area and a non-display area proximate to the display area;
a first input sensor disposed on the display panel and at least partially overlapping a first area of the display area; and
a second input sensor disposed on the display panel and at least partially overlapping a second area of the display area,
wherein the first input sensor comprises:
an insulating layer;
a first electrode;
a second electrode intersecting the first electrode;
a first trace line electrically connected to the first electrode;
a second trace line electrically connected to the first electrode; and
a third trace line electrically connected to the second electrode, wherein the first electrode is a single row structure extending substantially in a first direction in the display area, and wherein either the first trace line or the second trace line constitutes as a primary trace line and at least partially overlaps the first area of the display area, at least partially overlaps the first electrode, and does not overlap the second electrode.

2. The display device of claim 1, wherein the second electrode comprises a plurality of divided electrodes each extending substantially in a second direction crossing the first direction in the display area and spaced apart from each other in the first direction, and the primary trace line is disposed between the divided electrodes in the display area.

3. The display device of claim 2, wherein each of the divided electrodes is a single integral unit and is disposed on the insulating layer, and wherein the first electrode comprises:
 a plurality of sensing patterns disposed on the insulating layer and arranged in the first direction; and
 a plurality of bridge patterns, each disposed under the insulating layer and connecting neighboring pairs of sensing patterns, of the sensing patterns, to one another via a contact hole defined through the insulating layer.

4. The display device of claim 2,
wherein the primary trace line is disposed under the insulating layer,
wherein the first input sensor further comprises a plurality of dummy electrodes,
wherein the dummy electrodes and the primary trace line are disposed on a same layer, and
wherein the dummy electrodes at least partially overlap the sensing patterns.

5. The display device of claim 4, wherein the display area comprises a plurality of light emitting areas and a non-light-emitting area disposed between neighboring pairs of light emitting areas of the light emitting areas, and
wherein the primary trace line and the dummy electrodes overlap the non-light-emitting area.

6. The display device of claim 5, wherein each of the divided electrodes includes a plurality of openings defined therethrough.

7. The display device of claim 6, wherein each of the divided electrodes comprises line components that define the openings, and the lines components comprise a first line component extending in the first direction and a second line component extending in the second direction.

8. The display device of claim 6, wherein the light emitting areas comprise a first color light emitting area, a second color light emitting area, and a third color light emitting area,
wherein the first color light emitting area, the second color light emitting area, and the third color light emitting area define a unit light emitting area,
wherein the unit light emitting area comprises:
 a first unit light emitting area in which the first color light emitting area and the second color light emitting area are disposed at one side of the third color light emitting area and the third color light emitting area is disposed at a lower side with respect to the first color light emitting area and the second color light emitting area in the second direction; and
 a second unit light emitting area in which the first color light emitting area and the second color light emitting area are disposed at the one side of the third color light emitting area and the third color light emitting area is disposed at an upper side with respect to the first color light emitting area and the second color light emitting area in the second direction, the first unit light emitting area and the second unit light emitting area are alternately arranged with each other in the first direction and the second direction, and wherein the openings comprise a first opening corresponding to the first color light emitting area, a second opening corresponding to the second color light emitting area, and a third opening commonly corresponding to the third color light emitting area of the first unit light emitting area and the third color light emitting area of the second unit light emitting area, that are disposed adjacent to each other in the second direction.

9. The display device of claim 4, wherein each of the sensing patterns comprises a first line component extending in the first direction and a second line component extending in the second direction,
wherein each of the dummy electrodes comprises a first line component extending in the first direction and a second line component extending in the second direction,
wherein the first line component of the sensing patterns at least partially overlaps the first line component of the dummy electrodes, and
wherein the first line component of each of the sensing patterns has a width that is greater than a width of the first line component of each of the dummy electrodes.

10. The display device of claim 2, wherein the first electrode comprises a plurality of sensing patterns extending substantially in the second direction and spaced apart from each other in the first direction in the display area, and
wherein the primary trace line at least partially overlaps at least one sensing pattern among the sensing patterns and is connected to the at least one sensing pattern at least partially overlapping thereto among the sensing patterns in the display area.

11. The display device of claim 10, wherein the insulating layer is disposed between the primary trace line and the divided electrodes in the display area, and
wherein the primary trace line is connected to the at least one sensing pattern at least partially overlapping thereto among the sensing patterns via a contact hole defined through the insulating layer.

12. The display device of claim 1, wherein the first trace line is connected to the first electrode at a first point, the second trace line is connected to the first electrode at a second point, the third trace line is connected to the second electrode at a third point, the primary trace line is the second trace line, the second point is disposed in the first area of the display area, and each of the first point and the third point is disposed in the non-display area or is disposed closer to the non-display area than the second point is.

13. The display device of claim 1, wherein the second input sensor has a same composition as the first input sensor.

14. The display device of claim 1, wherein the first trace line is connected to the first electrode at a first point, the second trace line is connected to the first electrode at a second point, the third trace line is connected to the second electrode at a third point, the first input sensor further comprises a fourth trace line connected to the second electrode at a fourth point, and the fourth point is disposed in the non-display area or is disposed closer to the non-display area than the second point is.

15. The display device of claim 1, further comprising a third input sensor disposed on the display panel and at least partially overlapping a third area defined between the first area and the second area of the display area, wherein the third input sensor comprises:
- a first-first electrode corresponding to the first electrode;
- a second-first electrode corresponding to the second electrode and crossing the first-first electrode;
- a first-first trace line electrically connected to the first-first electrode; and
- a second-first trace line electrically connected to the second-first electrode,
- wherein the first-first trace line at least partially overlaps the third area of the display area and extends substantially in a same direction as a direction in which the second-first electrode extends in the third area of the display area, and
- wherein the first-first trace line at least partially overlaps the first-first electrode and does not overlap the second-first electrode in the third area of the display area.

16. The display device of claim 1, further comprising a third input sensor disposed on the display panel and at least partially overlapping a third area defined between the first area and the second area of the display area,
- wherein the third input sensor comprises:
  - a first-first electrode corresponding to the first electrode;
  - a second-first electrode corresponding to the second electrode and crossing the first-first electrode;
  - a first-first trace line electrically connected to the first-first electrode;
  - a second-first trace line electrically connected to the first-first electrode; and
  - a third-first trace line electrically connected to the second-first electrode,
  - wherein the second-first trace line at least partially overlaps the third area of the display area and extends substantially in a same direction as a direction in which the second-first electrode extends in the third area of the display area, and
  - wherein the second-first trace line at least partially overlaps the first-first electrode and does not overlap the second-first electrode in the third area of the display area.

17. The display device of claim 16, wherein the first-first trace line at least partially overlaps the first and third areas of the display area and extends substantially in a same direction as a direction in which the first-first electrode extends in the first area of the display area,
- wherein the first-first trace line at least partially overlaps the first electrode and the second electrode in the first area of the display area, and an overlap area between the first-first trace line and the first electrode is greater than an overlap area between the first-first trace line and the second electrode in the first area of the display area.

18. The display device of claim 17, wherein the first input sensor further comprises a fourth trace line connected to the second electrode at a point that is different from a point at which the third trace line is connected to the second electrode, and
- wherein the third input sensor further comprises a fourth-first trace line connected to the second-first electrode at a point that is different from a point at which the third-first trace line is connected to the second-first electrode.

19. The display device of claim 1, wherein the first trace line and the second trace line are branched from a pad connection line at one point in the non-display area, and the pad connection line is electrically connected to one pad.

20. A display device, comprising:
- a first electrode disposed in a first area, the first electrode being a single row structure;
- a second electrode disposed in the first area and crossing the first electrode;
- a first trace line electrically connected to the first electrode;
- a second trace line electrically connected to the first electrode;
- a third trace line electrically connected to the second electrode;
- a first-first electrode disposed in a second area that is different from the first area;
- a second-first electrode disposed in the second area and crossing the first-first electrode;
- a first-first trace line electrically connected to the first-first electrode;
- a second-first trace line electrically connected to the first-first electrode; and
- a third-first trace line electrically connected to the second-first electrode,
- wherein the first electrode and the first-first electrode are separated from each other,
- wherein the first trace line does not overlap the first area,
- wherein the second trace line at least partially overlaps the first area,
- wherein the second trace line at least partially overlaps the first electrode and does not overlap the second electrode,
- wherein the first-first trace line does not overlap the second area,
- wherein the second-first trace line at least partially overlaps the second area, and
- wherein the second-first trace line at least partially overlaps the first-first electrode and does not overlap the second-first electrode in the second area.

* * * * *